(12) United States Patent
Ogawa et al.

(10) Patent No.: US 10,290,496 B2
(45) Date of Patent: May 14, 2019

(54) SUBSTRATE PROCESSING APPARATUS AND SUBSTRATE PROCESSING METHOD

(71) Applicant: TOKYO ELECTRON LIMITED, Tokyo (JP)

(72) Inventors: Jun Ogawa, Yamanashi (JP); Kazuo Yabe, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/660,563

(22) Filed: Jul. 26, 2017

(65) Prior Publication Data

US 2018/0033618 A1 Feb. 1, 2018

(51) Int. Cl.
*C23C 16/34* (2006.01)
*C23C 16/40* (2006.01)
(Continued)

(52) U.S. Cl.
CPC ...... *H01L 21/02315* (2013.01); *C23C 16/345* (2013.01); *C23C 16/402* (2013.01); *C23C 16/452* (2013.01); *C23C 16/4583* (2013.01); *C23C 16/4586* (2013.01); *C23C 16/45542* (2013.01); *C23C 16/45546* (2013.01); *C23C 16/45578* (2013.01); *C23C 16/509* (2013.01); *H01J 37/20* (2013.01); *H01J 37/32009* (2013.01); *H01J 37/32532* (2013.01); *H01L 21/31116* (2013.01); *H01J 2237/038* (2013.01); *H01L 21/0228* (2013.01); *H01L 21/02164* (2013.01); *H01L 21/02219* (2013.01); *H01L 21/02274* (2013.01)

(58) Field of Classification Search
None
See application file for complete search history.

(56) References Cited

U.S. PATENT DOCUMENTS 7,462,571 B2 * 12/2008 Hasebe ............... C23C 16/30
438/775
8,267,041 B2 * 9/2012 Abe ............... H01J 37/32183
118/663

(Continued)

FOREIGN PATENT DOCUMENTS

JP 2014-93226 A 5/2014
JP 2015-12275 A 1/2015

*Primary Examiner* — David E Graybill
(74) *Attorney, Agent, or Firm* — Nath, Goldberg & Meyer; Jerald L. Meyer

(57) ABSTRACT

A substrate processing apparatus includes: a protrusion portion formed by a side peripheral wall of a processing container which swells outward, and configured to form a vertically elongated space communicating with a processing space for accommodating a substrate holder and performing a process; a gas discharge portion provided in the vertically elongated space, and configured to discharge a process gas into the processing space; an antenna provided in the protrusion portion along a vertical direction and supplied with a high-frequency power for converting the process gas into a plasma in the vertically elongated space; and a shield extending leftward and rightward in the protrusion portion at positions closer to the processing space than the antenna and configured to shield an electric field formed by the antenna and to suppress a formation of the plasma in the processing space.

6 Claims, 24 Drawing Sheets

(51) Int. Cl.
*H01J 37/20* (2006.01)
*H01J 37/32* (2006.01)
*H01L 21/02* (2006.01)
*C23C 16/452* (2006.01)
*C23C 16/455* (2006.01)
*C23C 16/458* (2006.01)
*C23C 16/509* (2006.01)
*H01L 21/311* (2006.01)

(56) References Cited

U.S. PATENT DOCUMENTS

| | | | | |
|---|---|---|---|---|
| 8,608,902 | B2* | 12/2013 | Fukushima | C23C 16/345 |
| | | | | 118/723 I |
| 8,683,943 | B2* | 4/2014 | Onodera | C23C 16/402 |
| | | | | 118/666 |
| 9,447,926 | B2* | 9/2016 | Onodera | C23C 16/402 |
| 9,970,111 | B2* | 5/2018 | Fukushima | C23C 16/452 |
| 2006/0032443 | A1* | 2/2006 | Hasebe | C23C 16/30 |
| | | | | 118/715 |
| 2008/0093024 | A1* | 4/2008 | Abe | H01J 7/32091 |
| | | | | 156/345.44 |
| 2009/0056877 | A1* | 3/2009 | Matsuura | C23C 16/345 |
| | | | | 156/345.48 |
| 2010/0186898 | A1* | 7/2010 | Fukushima | C23C 16/345 |
| | | | | 156/345.48 |
| 2014/0123895 | A1* | 5/2014 | Kato | H01J 37/321 |
| | | | | 118/697 |
| 2015/0007772 | A1* | 1/2015 | Fukushima | C23C 16/452 |
| | | | | 118/723 E |

* cited by examiner

SUBSTRATE PROCESSING APPARATUS AND SUBSTRATE PROCESSING METHOD

CROSS-REFERENCE TO RELATED APPLICATIONS

This application is based upon and claims the benefit of priority from Japanese Patent Application Nos. 2016-151400, filed on Aug. 1, 2016, and 2016-173746, filed on Sep. 6, 2016, the entire contents of which are incorporated herein by reference.

TECHNICAL FIELD

The present disclosure relates to a substrate processing apparatus and a substrate processing method for performing the plasma processing by loading a substrate holder holding a plurality of substrates in a shelf-like manner into a vertical processing container.

BACKGROUND

In manufacturing a semiconductor device, a large number of semiconductor wafers (hereinafter referred to as "wafers"), which are substrates, are held in a holder called a wafer boat in multiple stages and are loaded into a vertical processing container. A process gas is supplied from the side of the respective wafers and is converted into plasma to perform processing collectively. In the related art, there is known an apparatus that performs such plasma processing. Examples of this plasma processing include a film forming process using an ALD (Atomic Layer Deposition) process to form a $SiO_2$ (silicon oxide) film or the like. In forming the $SiO_2$ film, a step of supplying a source gas containing Si (silicon) to a wafer and causing the source gas to be adsorbed onto the wafer, and a step of converting an oxidizing gas for oxidizing the source gas adsorbed onto the wafer into plasma and supplying the active species of the oxidizing gas are repeatedly performed.

In addition to a product wafer from which a semiconductor device is manufactured, a monitoring wafer for monitoring how a film is formed on the product wafer is mounted on the wafer boat. A recess for forming a wiring of the semiconductor device is formed on the surface of the product wafer. However, the wiring is not formed on the surface of the monitoring wafer. Therefore, the recess is not formed on the monitoring wafer.

As for the products wafer, in order to increase the yield of the semiconductor device, it is required that a film be formed so as to increase the film thickness uniformity in the respective parts in a plane. When the film formation is performed with high film thickness uniformity in the respective parts in the plane of the product wafer as described above, from the viewpoint of grasping the film formation state of the product wafer, it is also required that a film be formed on the monitoring wafer so as to increase the film thickness uniformity in the respective parts in the plane.

As the recess is miniaturized, the surface area of the product wafer tends to increase. If the surface area increases, the active species of the process gas converted into plasma are not sufficiently spread to the plane of the product wafer. This may lead to a problem called micro-loading in which uneven processing is performed in the plane of the product wafer. In order to prevent this problem, it is considered to prolong the time for supplying the active species. That is to say, when forming the $SiO_2$ film as described above, the active species of an $O_2$ gas are supplied over a relatively long period of time.

If the supply time of the active species of the $O_2$ gas is prolonged as described above, it is possible to form a $SiO_2$ film with high film thickness uniformity in the respective parts in the plane of the product wafer. However, it was confirmed that the film thickness of the $SiO_2$ film in the peripheral edge portion of the monitoring wafer becomes smaller than the film thickness of the $SiO_2$ film in the central portion of the monitoring wafer. The reason why the film thickness becomes non-uniform in the plane of the monitoring wafer as described above may be as follows. The surface of each wafer subjected to the film forming process is in a charged state. Among the active species of the $O_2$ gas supplied from the side of each wafer, ions opposite in polarity to the peripheral edge portion of the charged wafer are attracted to the peripheral edge portion of the wafer. By increasing the supply time of the active species as described above, a lot of ions are attracted to the peripheral edge portion of each wafer. Since the recess is not formed on the monitoring wafer, the amount of ions attracted and supplied per predetermined surface area of the monitoring wafer is larger than that of the product wafer. Thus, the modification of the $SiO_2$ film proceeds greatly. As a result, it is considered that the film thickness in the peripheral edge portion of the monitoring wafer becomes smaller. As described above, there is a trade-off relationship between the film thickness uniformity in the plane of the product wafer and the film thickness uniformity in the plane of the monitoring wafer.

In the processing apparatus of the related art, the side peripheral wall of the processing container swells outward, thereby forming a protrusion portion that defines a vertically elongated space communicating with a processing space for accommodating a substrate holder and performing a process. An antenna for forming inductively coupled plasma in the vertically elongated space is provided on one of the left and right outer walls of the protrusion portion. A shield for shielding an electric field is provided on the front side of the antenna (at a position close to the processing space). However, even if the shield is disposed only on the front side of the antenna as described above, the action of the ions may not be sufficiently suppressed. Further, in another processing apparatus of the related art, there are provided a protrusion portion similar to that of the aforementioned apparatus of the related art, parallel flat plate type electrodes disposed to sandwich the protrusion portion from the left and right sides thereof and configured to form capacitively coupled plasma inside the protrusion portion, and shields disposed to sandwich the protrusion portion from the left and right sides thereof and configured to be position-adjustable back and forth. However, when forming the capacitively coupled plasma in such a manner, there is a concern that it is difficult to generate the active species in such an amount as to sufficiently spread to the wafer having a large surface area as described above.

SUMMARY

Some embodiments of the present disclosure provide a technique capable of performing a process with high uniformity in a plane of each substrate when loading a substrate holder holding a plurality of substrates in a shelf-like manner into a vertical processing container and performing the plasma processing.

According to one embodiment of the present disclosure, there is provided a substrate processing apparatus which performs processing by loading a substrate holder holding a plurality of substrates in a shelf-like manner into a vertical processing container and supplying a process gas. The substrate processing apparatus includes: a protrusion portion formed by a side peripheral wall of the processing container which swells outward, and configured to form a vertically elongated space communicating with a processing space for accommodating the substrate holder and performing a process; a gas discharge portion provided in the vertically elongated space, and configured to discharge the process gas into the processing space; an antenna provided in the protrusion portion along a vertical direction and supplied with a high-frequency power for converting the process gas into a plasma in the vertically elongated space; and a shield extending leftward and rightward from the protrusion portion at positions closer to the processing space than the antenna and configured to shield an electric field formed by the antenna and to suppress a formation of the plasma in the processing space.

According to another embodiment of the present disclosure, there is provided a substrate processing method using a substrate processing apparatus which performs processing by loading a substrate holder holding a plurality of substrates in a shelf-like manner into a vertical processing container and supplying a process gas. The substrate processing method includes: discharging the process gas into a processing space from a gas discharge portion provided in a vertically elongated space of a protrusion portion which is formed by a side peripheral wall of the processing container which swells outward, and which is configured to form the vertically elongated space communicating with the processing space for accommodating the substrate holder and performing a process; converting the process gas into a plasma in the vertically elongated space by supplying a high-frequency power to an antenna provided in the protrusion portion along a vertical direction; and suppressing a formation of the plasma in the processing space by assuring that an electric field formed by the antenna is shielded by a shield extending leftward and rightward from the protrusion portion at positions closer to the processing space than the antenna.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
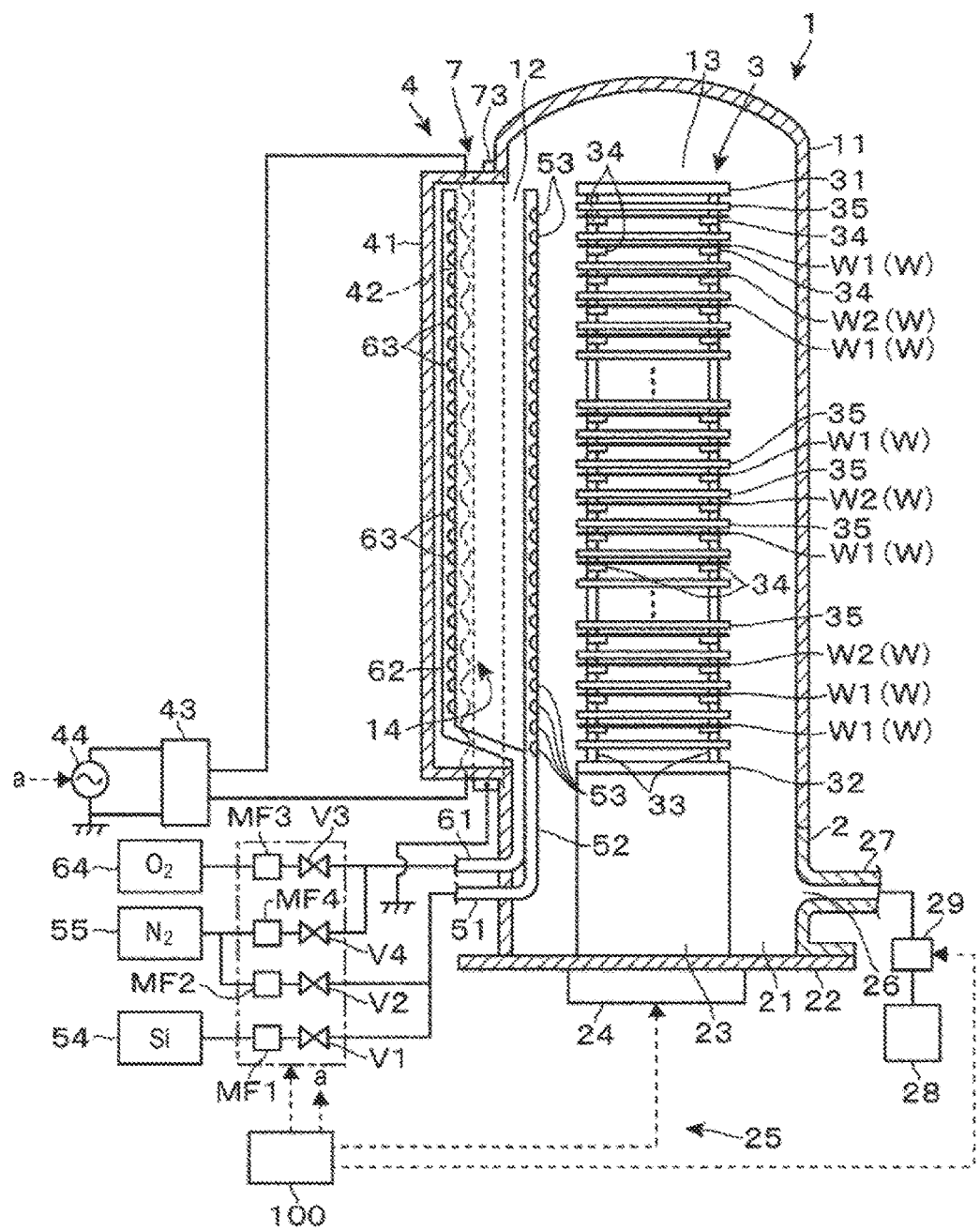
FIG. 1 is a vertical sectional side view of a film forming apparatus according to one embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 1 which is one embodiment of the substrate processing apparatus of the present disclosure will be described with reference to a vertical sectional side view of FIG. 1 and a horizontal sectional plan view of FIG. 2. In the film forming apparatus 1, a $SiO_2$ film is formed by the ALD process on each of a large number of wafers W which are circular substrates held by a wafer boat 3 as a substrate holder. In the drawings, reference numeral 11 designates a quartz-made processing container. The processing container 11 is formed in a vertically-elongated cylindrical shape with a ceiling.

A manifold 2 formed in a cylindrical shape is connected to the lower end side of the vertical processing container 11. The lower end of the manifold 2 is opened as a substrate loading/unloading port 21 and is airtightly closed by a quartz-made lid 22 which is moved up and down by an elevator mechanism (not shown). A stage 23 on which the wafer boat 3 is placed is provided on the upper side of the lid 22. On the lower side of the lid 22, a rotation mechanism 24 for rotating the stage 23 about a vertical axis is provided.

The wafer boat 3 will now be described. The wafer boat 3 includes a horizontal circular top plate 31, a horizontal circular bottom plate 32, vertical support pillars 33, claw portions 34, and horizontal circular ring plates 35. These parts are made of quartz. The support pillars 33 are connected to the peripheral edge portion of the top plate 31 and the peripheral edge portion of the bottom plate 32. For example, three support pillars 33 (only two of which are shown in FIG. 1) are provided at intervals in the circumferential direction of the top plate 31 and the bottom plate 32. The claw portions 34 protrude from the respective support pillars 33 toward the center portion of the region surrounded by the support pillars 33. The peripheral edge portions of the wafers W are placed on the claw portions 34 extending from the support pillars 33, whereby the wafers W are horizontally held on the wafer boat 3. The claw portions 34 are provided in a large number in the vertical direction on each of the support pillars 33 so that a large number of wafers W, for example, 75 wafers W can be held in a shelf-like manner. The interval between the wafers W held vertically adjacent to each other is, for example, 12.6 mm.

In addition, a large number of the ring plates 35, which are plate-shaped members, are provided on the support pillars 33. If the regions where the wafers W are held are called slots, the ring plates 35 are provided separately from the slots on the upper and lower sides of each of the slots. The ring plates 35 and the slots are alternately arranged in the wafer boat 3 from the upper side toward the lower side. In FIG. 2, reference numeral 36 designates an opening of each of the ring plates 35. The center axis of each of the ring plates 35 coincides with the center axis of each of the wafers W held in the respective slots. The outer diameter of the ring plates 35 is larger than the diameter of the wafers W. Therefore, as shown in FIG. 2, the peripheral edges of the ring plates 35 are positioned on the outer side of the peripheral edges of the wafers W over the entire circumferences of the wafers W when seen in a plan view.

As described above, the ring plates 35 are made of quartz which is a dielectric material. Therefore, the surfaces of the ring plates 35 may be polarized and charged positively or negatively. This charging is caused by the friction with the respective gases supplied into the processing container 11, or the like. As described in the section of background, the surfaces of the wafers W may be charged during the film forming process. Similar to the cause of charging of the ring plates 35, the charging of the surfaces of the wafers W appears to be caused by the factors such as the friction with the gases flowing through the processing container 11, or the like. By being charged as described above, the ring plates 35 serve as attraction portions that attract positive or negative ions constituting plasma in place of the charged wafers W. When the stage 23 rotates, the ring plates 35 and the wafers W rotate about their center axes.

By the way, as described in the section of background, the wafers W held by the wafer boat 3 includes product wafers from which a semiconductor device is manufactured and monitoring wafers on which films are formed in order to monitor the film formation state of the product wafers. Hereinafter, as for the wafers W, there may be a case where the product wafers are referred to as wafers W1 and the monitoring wafers are referred to as wafers W2, thereby distinguishing the product wafers and the monitoring wafers from each other. In this example, the process is performed by holding three wafers W2 one by one in the mutually separated slots of the top part, the center part and the bottom part of the wafer boat 3 and holding the wafers W1 in the slots in which the wafers W2 are not held.

Figure 3:
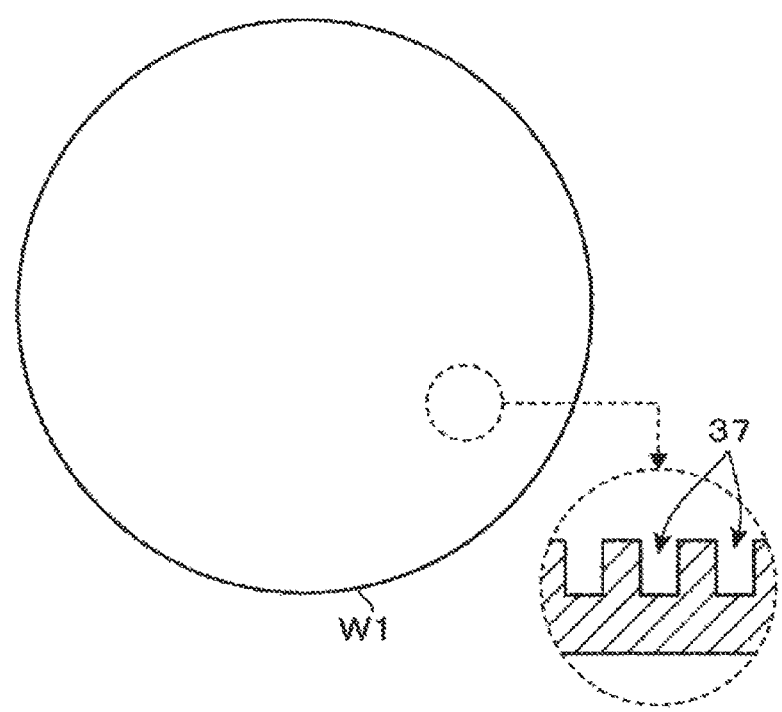
FIG. 3 is a plan view of a wafer processed in the film forming apparatus.
Figure 4:
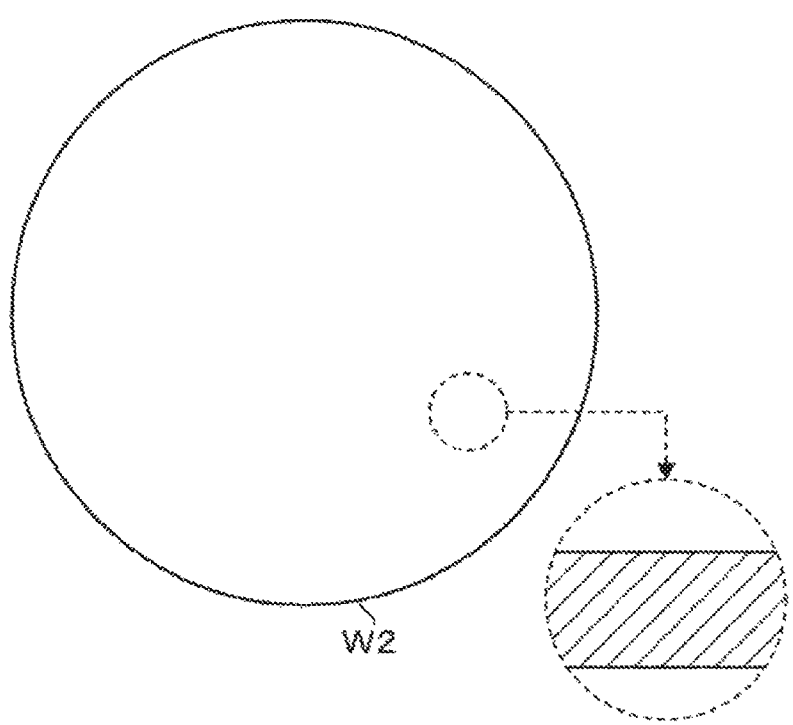
FIG. 4 is a plan view of a wafer processed in the film forming apparatus.

FIGS. 3 and 4 show the surface of the wafer W1 and the surface of the wafer W2, respectively. In FIGS. 3 and 4, the vertical cross-sections of the wafer W1 and the wafer W2 are respectively shown within dot line frames indicated by arrowheads. Regarding the diameter and the thickness, the wafer W1 and the wafer W2 are the same. A large number of recesses 37 are formed on the surface of the wafer W1 which is a first substrate. The recesses 37 are not formed on the surface of the wafer W2 which is a second substrate. The surface of the wafer W2 is configured as a flat surface. By respectively configuring the wafer W1 and the wafer W2 in this manner, the surface area on the front surface side of the wafer W1 is, for example, 10 times or more than the surface area on the front surface side of the wafer W2.

Returning to FIGS. 1 and 2, the description of the film forming apparatus 1 will be continued. As the lid 22 of the processing container 11 moves up and down as described above, the wafer boat 3 can be raised and lowered between a processing position inside the processing container 11 and a loading/unloading position in a loading area 25 of a vacuum atmosphere existing below the processing container 11. When the wafer boat 3 is located at the processing position, the substrate loading/unloading port 21 of the processing container 11 is closed by the lid 22. The loading/unloading position is a position where the wafers W are transferred to the wafer boat 3 by a transfer mechanism (not shown) provided in the loading area 25.

An opening 12 is formed in a side wall of the processing container 11, and a plasma forming part 4 is provided outside the opening 12. The opening 12 is formed in a vertically elongated slit shape so that the active species of plasma generated by the plasma forming part 4 can be supplied to the respective wafers W held on the wafer boat 3. The opening 12 is closed from the outside by a quartz-made plasma forming box 41 having a horizontal cross section formed in a recess shape. Accordingly, the plasma forming box 41 constitutes the side wall of the processing container 11. The side wall of the processing container 11 bulges toward the outside of the processing container 11 to form a protrusion portion.

Inside the processing container 11, a space which exists outside the interior of the plasma forming box 41 and in which the wafer boat 3 is accommodated as described above is defined as a processing space 13. Further, the back side remote from the opening 12 in the plasma forming box 41 is configured as a plasma forming space 14 where the plasma is formed. In the following description, the side of the processing space 13 and the side of the plasma forming space 14 are referred to as a front side and a back side, respectively. The plasma forming part 4 will be described in more detail later.

On the side wall of the manifold 2, an exhaust port 26 for exhausting the interior of the processing container 11 is opened. One end of an exhaust pipe 27 is connected to the exhaust port 26, and the other end of the exhaust pipe 27 is connected to an exhaust mechanism 28 composed of a vacuum pump or the like. A pressure regulating part 29 for adjusting the exhaust amount and regulating the internal pressure of the processing container 11 to a predetermined vacuum pressure is provided in the exhaust pipe 27. As shown in FIG. 2, when seen in a plan view, the exhaust port 26 is opened at a position slightly shifted in the circumferential direction from the opening 12. However, in FIG. 1, for the sake of convenience of illustration, the exhaust port 26 is shown as if it is located on the side opposite to the opening 12.

A first gas supply pipe 51 and a second gas supply pipe 61 are inserted into the side wall of the manifold 2. A first gas nozzle 52 and a second gas nozzle 62 are provided in the distal end portion of the first gas supply pipe 51 and the distal end portion of the second gas supply pipe 61, respectively. The first gas nozzle 52 and the second gas nozzle 62 are composed of a quartz tube. The first gas nozzle 52 is provided so as to extend upward along the side wall of the processing container 11 at a position spaced apart from the opening 12 in the processing space 13. A plurality of gas discharge holes 53 is formed at predetermined intervals along the length direction of the first gas nozzle 52. The second gas nozzle 62 is provided so as to extend upward on the back side of the plasma forming space 14 which is a vertically elongated space. A plurality of gas discharge holes 63 is formed at predetermined intervals along the length direction of the second gas nozzle 62.

The upstream side of the first gas supply pipe 51 is branched into two branch paths. The upstream side of one branch path is connected to a supply source 54 of a dipropylaminosilane (DPAS) gas, which is a source gas containing Si for forming a $SiO_2$ film, via a valve V1 and a flow rate control part MF1 in the named order. The upstream side of the other branch path is connected to a supply source 55 of an $N_2$ (nitrogen) gas via a valve V2 and a flow rate control part MF2 in the named order. The $N_2$ gas is a purge gas for purging the internal atmosphere of the processing container 11.

In addition, the upstream side of the second gas supply pipe 61 is branched into two branch paths. The upstream side of one branch path is connected to a gas supply source 64 for supplying an oxygen ($O_2$) gas, via a valve V3 and a flow rate control part MF3 in the named order. The upstream side of the other branch path is connected to the aforementioned $N_2$ gas supply source 55 via a valve V4 and a flow rate control part MF4 in the named order. The $O_2$ gas is a process gas which is converted into plasma as described later and supplied to the wafers W to oxidize the source gas adsorbed onto the wafers W. The respective valves V perform supplying and stopping the supply of gases, and the respective flow rate control parts MF perform controlling of the gas supply amounts.

Figure 5:
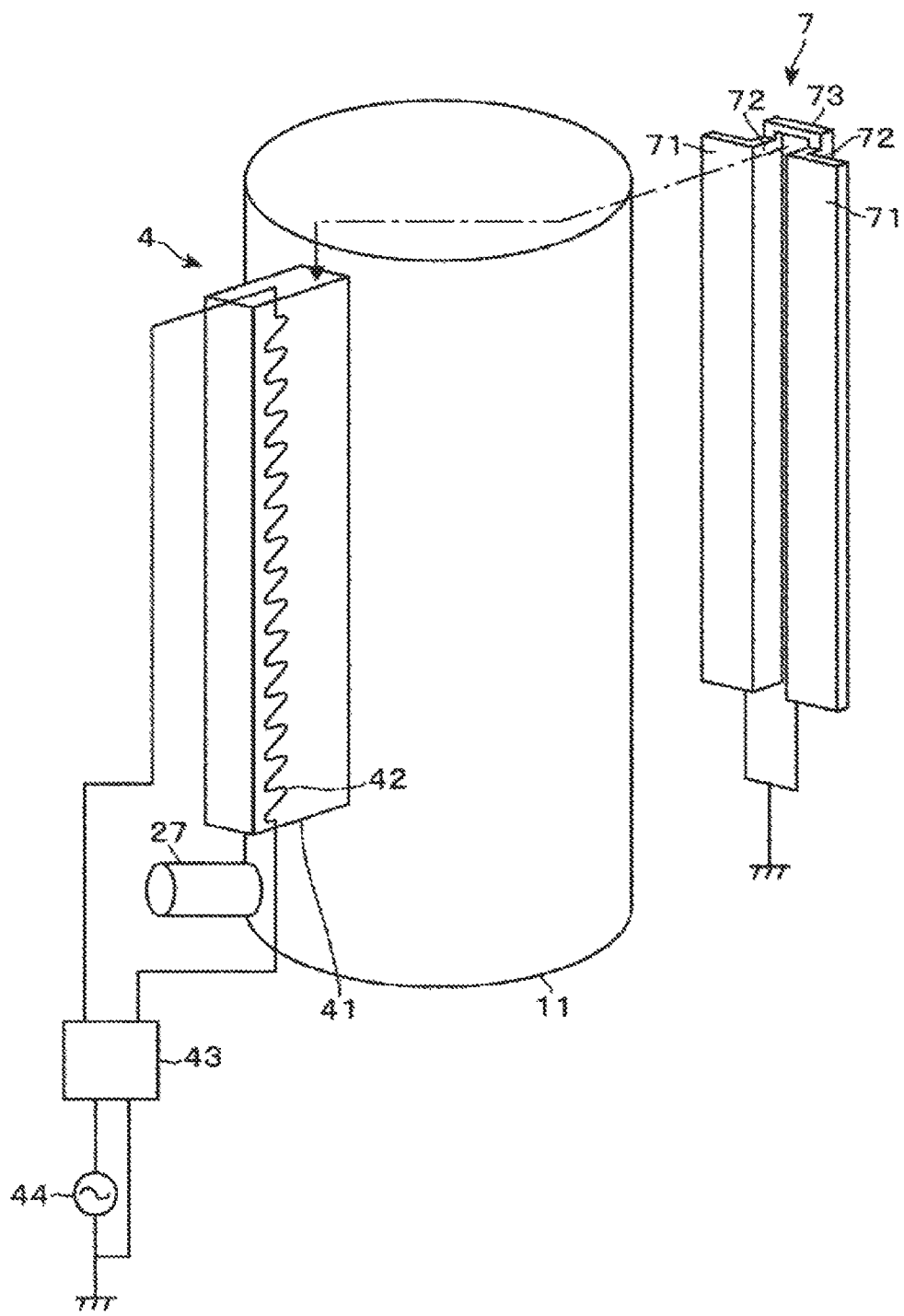
FIG. 5 is a schematic perspective view of the film forming apparatus.

Subsequently, the plasma forming part 4 will be described in more detail with reference also to the schematic perspective view of FIG. 5. When seen from the back side toward the front side, an antenna 42 extending in the vertical direction from the upper end portion of the plasma forming box 41 to the lower end portion thereof is provided so as to adjoin the rear outer side of the right side wall of the plasma forming box 41. The antenna 42 is provided so as to vertically extend while repeatedly meandering forward and backward. One end and the other end of the antenna 42 are connected to a grounded high-frequency power source 44 via a matcher 43. The second gas nozzle 62 and the antenna 42 are provided, for example, at the same position in the front-back direction as shown in FIG. 2. However, in FIG. 1, for the sake of convenience of illustration, the positions of the second gas nozzle 62 and the antenna 42 are shown to be shifted back and forth.

If the high frequency power is supplied from the high-frequency power source 44 to the antenna 42, an electric field is formed to spread from the antenna 42 to the surroundings of the antenna 42. The gas discharged from the second gas nozzle 62 into the plasma forming box 41 is converted into plasma by the electric field. In other words, the inductively coupled plasma (ICP) is formed by the antenna 42. By adjusting the degree of bending of the antenna 42, the intensity of the electric field around the antenna 42 can be changed and the generation amount of the active species of the plasma can be adjusted. That is to say, the antenna 42 may be bent so as to generate a relatively large amount of the active species. By generating a large amount of the active species as described later, it is possible to make the thickness of a film formed on the wafer W uniform. In FIG. 2, reference numeral 45 designates an insulating member which surrounds the antenna 42 to insulate the antenna 42 from the surroundings.

In addition, the plasma forming part 4 is provided with a shield 7. The shield 7 has a role of shielding the electric field and suppressing the formation of the electric field in the processing space 13 and on the front side of the plasma forming box 41. The shield 7 is configured by a conductor made of, for example, metal such as SUS (stainless steel) or the like. The shield 7 includes main plates 71 extending from the left and right side walls of the plasma forming box 41 in the lateral direction, sub plates 72 extending from the base ends of the respective main plates 71 toward the front side along the side walls of the plasma forming box 41, and a connecting portion 73. For example, the shield 7 is grounded by a conductive wire extending from the lower ends of the sub plates 72.

The main plates 71 and the sub plates 72 are provided from the upper end to the lower end of the plasma forming box 41 on the front side of the position where the antenna 42 and the insulating member 45 are provided. The main plate 71 and the sub plate 72 provided on each of the left side and the right side of the plasma forming box 41 are formed by one vertically-elongated plate bent by approximately 90° along the vertical axis. Accordingly, the main plate 71 and the sub plate 72 forms an L shape as seen in the vertical direction. The thickness L1 of the main plate 71 and the sub plate 72 shown in FIG. 2 is, for example, 2 mm to 3 mm. Further, when seen from the back side toward the front side, the length L2 of the right main plate 71 in the left-right direction is, for example, 25 mm and the length L3 of the left main plate 71 in the left-right direction is, for example, 8 mm to 17 mm. In this manner, among the two main plates 71, the right main plate 71 at which the antenna 42 is provided is formed to be longer than the left main plate 71 so that the electric field can be reliably shielded.

Each main plate 71 is arranged in a region in the vicinity of the antenna 42 where the electric field strength is high. In order to effectively shield the electric field, each main plate 71 is provided so that the proximal end side thereof makes contact with the plasma forming box 41. Even if only each main plate 71 is provided without providing each sub plate 72, the shield is provided in a relatively wide range when the processing space 13 is seen from the antenna 42. Thus, the electric field is sufficiently shielded. It is therefore possible to obtain the effect of forming films on the below-described wafers W1 and W2 with high film thickness uniformity. However, by providing the sub plate 72, the area of the shield provided on the front side as viewed from the antenna 42 is further increased. This makes it possible to more reliably perform the shielding of the electric field. Furthermore, the sub plate 72 is provided in a space between the main plate 71 and the portion of the side wall of the processing container 11 forming the processing space 13. It is therefore possible to suppress an increase in the occupied floor area of the apparatus. The sub plate 72 is fixed to the side wall of the plasma forming box 41 by fasteners (not shown). The sub plate 72 also has a role of fixing the shield 7 to the plasma forming box 41. The connecting portion 73 is connected to the upper ends of the left and right sub plates 72 and is supported on the upper portion of the plasma forming box 41.

Figure 2:
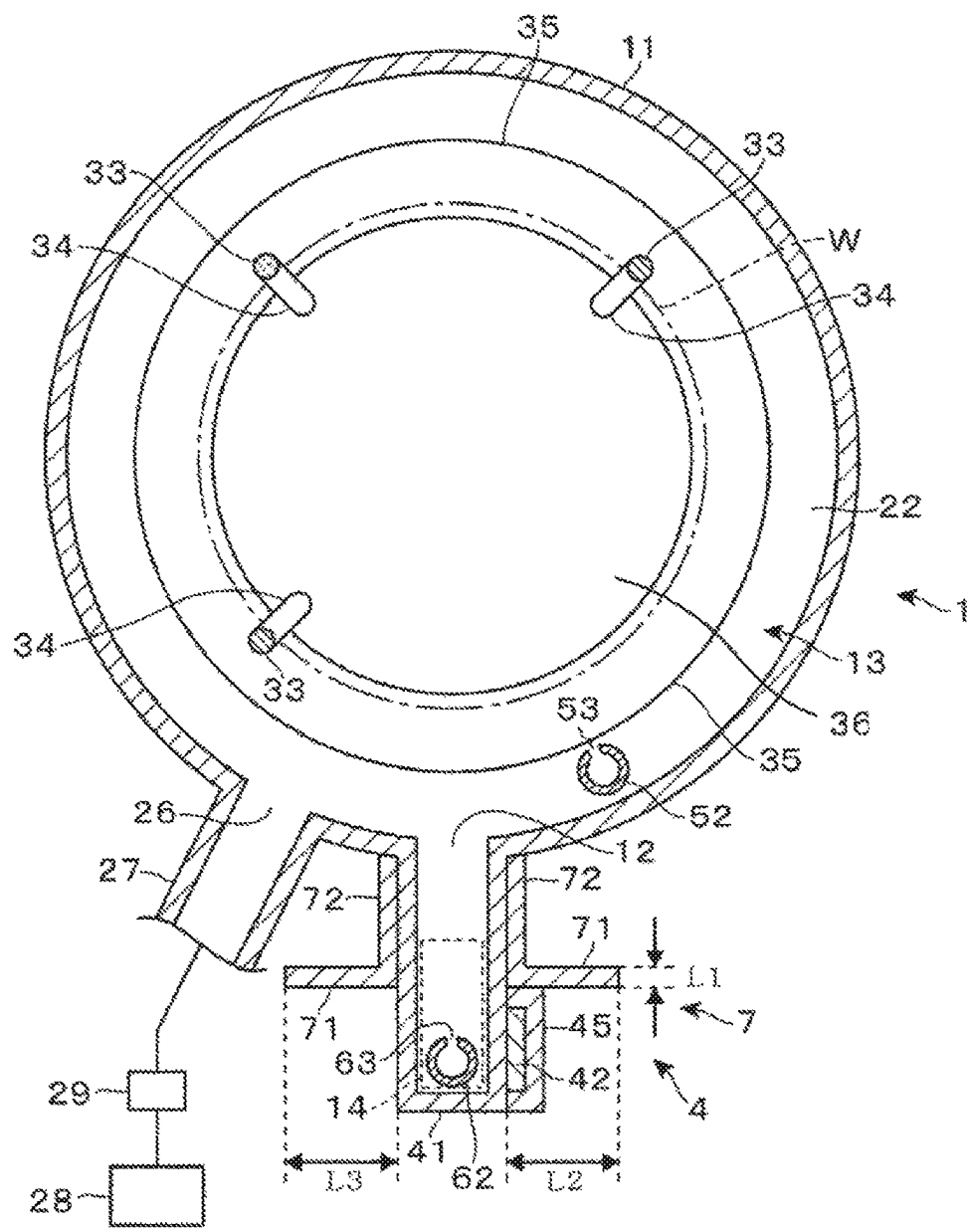
FIG. 2 is a horizontal sectional plan view of the film forming apparatus.

Further, as shown in FIG. 1, the film forming apparatus 1 is provided with a control part 100. The control part 100 is configured by a computer. The control part 100) controls the raising and lowering of the lid 22, the supply amounts of the gases by the respective flow rate control parts MF, the opening and closing of the respective valves V, the on/off of the high-frequency power source 44, the exhaust amount by the pressure regulating part 29, the rotation of the stage 23 by the rotation mechanism 24, and the like. The control part 100 is provided with a program capable of executing a series of processing steps to be described later. According to the program, the control part 100 outputs control signals to the respective parts of the film forming apparatus 1 and controls the operations of the respective parts. The program is stored in the control part 100 in a state in which the program is stored in a storage medium such as a hard disk, a flexible disk, a compact disk, a magneto-optical disk (MO), a memory card, or the like.

Subsequently, a film forming process performed by the film forming apparatus 1 will be described. First of all, the wafers W1 and the wafers W2 are mounted and held in the respective slots of the wafer boat 3 at the loading/unloading position by the transfer mechanism (not shown) as described above. Thereafter, the wafer boat 3 is loaded into the processing space 13 of the processing container 11 from below, the substrate loading/unloading port 21 is closed by the lid 22, and the processing container 11 is hermetically sealed. Then, the interior of the processing container 11 is brought into a vacuum atmosphere of a predetermined pressure by the pressure regulating part 29. The wafer boat 3 is rotated by the rotation mechanism 24.

Subsequently, an $N_2$ gas as a purge gas is supplied from the first gas nozzle 52 and the second gas nozzle 62 (time t1), and the atmosphere in the processing container 11 is purged (step S1). For example, after 5 seconds from time t1, the discharge of the purge gas from the first gas nozzle 52 and the second gas nozzle 62 is stopped, and a DPAS gas is discharged from the first gas nozzle 52 (time t2). The discharged DPAS gas is adsorbed onto the surface of each wafer W (step S2). For example, after 6 seconds from time t2, the discharge of the DPAS gas from the first gas nozzle 52 is stopped, and the purge gas is discharged from the first gas nozzle 52 and the second gas nozzle 62 (time t3). The DPAS gas remaining in the processing container 11 is purged by the purge gas, and the interior of the processing container 11 is replaced by the $N_2$ gas atmosphere (step S3).

For example, if 3 seconds elapses from time t3, the discharge of the purge gas from the first gas nozzle 52 and the second gas nozzle 62 is stopped, and the discharge of an $O_2$ gas from the second gas nozzle 62 is started (time t4). The flow rate of the discharged $O_2$ gas increases gradually and becomes a predetermined set value at, for example, one second after time t4 (time t5). The supply of the $O_2$ gas is continuously performed at the set value. If a gas with a relatively large flow rate is suddenly supplied to the gas nozzle, there is a possibility that the gas nozzle resonates and causes particles to be generated. Therefore, in order to prevent the generation of the particles, the flow rate of the $O_2$ gas is gradually increased as described above.

For example, after 3 seconds from time t5, the high-frequency power source 44 is turned on while the $O_2$ gas is being discharged (time t6). An electric field is formed around the antenna 42 by supplying the high frequency power. The $O_2$ gas discharged from the second gas nozzle 62 is turned into plasma. Oxygen radicals and oxygen ions, which are the active species of the $O_2$ gas, are generated in the plasma forming space 14 of the plasma forming box 41 and are supplied toward the processing space 13. Incidentally, the oxygen ions include $O_2^+$ and $O_2^-$. In other words, the oxygen ions include ions having a positive polarity and ions having a negative polarity.

Figure 6:
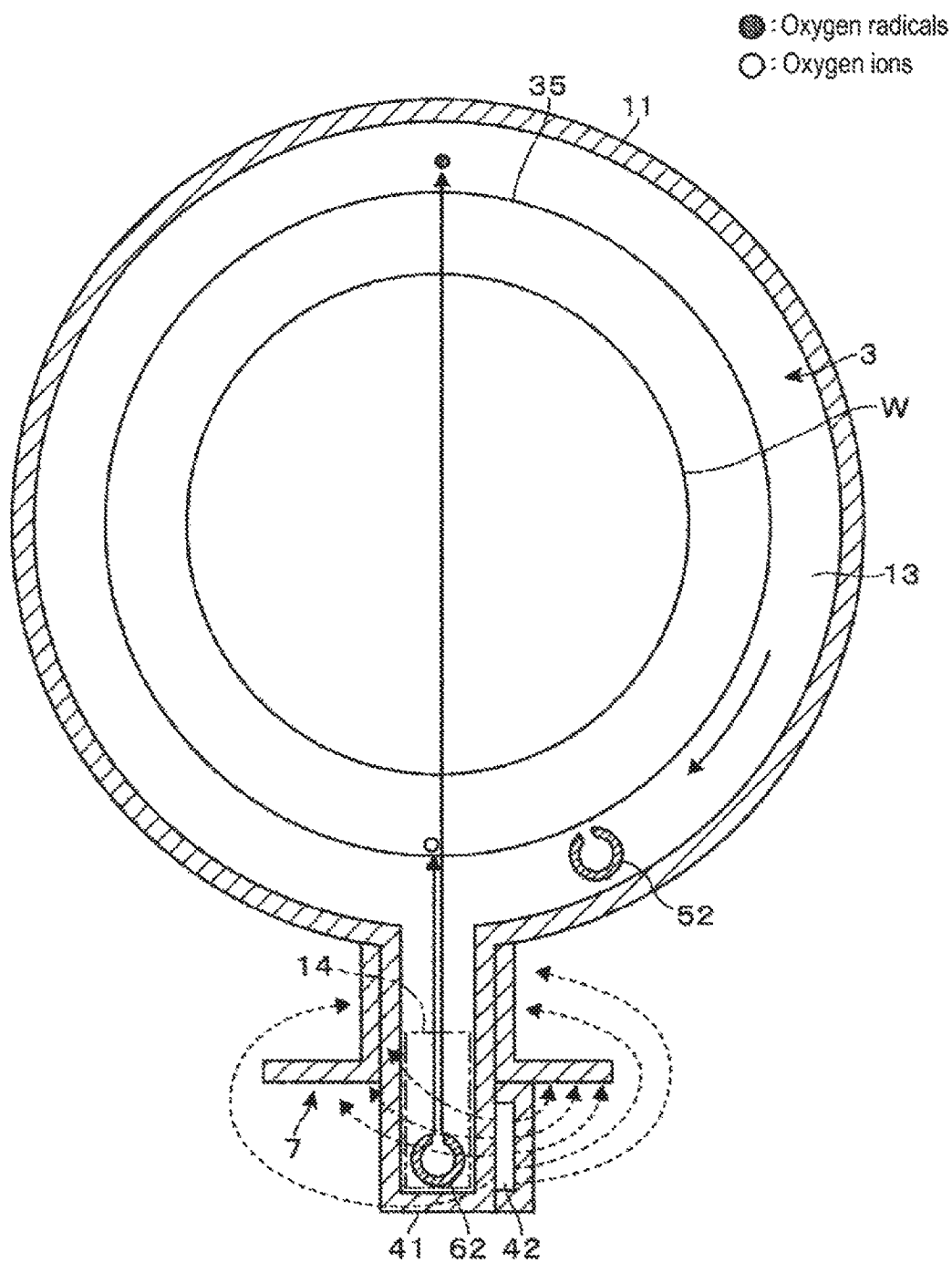
FIG. 6 is a schematic horizontal sectional plan view of the film forming apparatus.

Since a relatively strong electric field can be formed in the plasma forming space 14 by the antenna 42 for forming the ICP as described above, it is possible to generate a large amount of the active species. In FIG. 6, the electric field formed in this way is schematically shown by dot line arrows. Since the electric field is shielded by the shield 7 formed as described above, it is difficult for the $O_2$ gas to be turned into plasma on the front side of the plasma forming space 14. Since the lifetime of the ions is shorter than the lifetime of the radicals, the oxygen ions among the active species directed from the plasma forming space 14 to the processing space 13 tend to be deactivated before reaching the wafer W. Since the electric field is shielded as described above, the deactivated oxygen ions are inhibited from being ionized again by the action of the electric field. Accordingly, the oxygen radicals are mainly supplied to the wafer W.

Since the oxygen radicals are electrically neutral, the oxygen radicals are not affected by the charged state of the wafer W and flows along the diameter of the rotating wafer W as indicated by a solid line arrow in FIG. 6. Inasmuch as the oxygen radicals are generated relatively much in the plasma forming space 14 together with the oxygen ions as described above, the oxygen radicals are sufficiently supplied to the respective portions of the wafer W along the diametric direction. In other words, although the surface area of the wafer W1 is large, in the plane of the wafer W1, the oxygen radicals are not completely consumed in the peripheral edge portion of the wafer W1 on the side of the plasma forming box 41. The oxygen radicals are also supplied to the central portion and the peripheral edge portion opposite to the plasma forming box 41. That is to say, the oxygen radicals are supplied with high uniformity in the diametric direction of the wafer W1. Similar to the wafer W1, the oxygen radicals are also supplied to the wafer W2 with high uniformity in the diametric direction. Since the wafers W1 and W2 are rotating, the oxygen radicals are supplied to the entire surfaces of the wafers W1 and W2 with high uniformity. Thus, the absorbed DPAS gas is oxidized to form a thin layer of $SiO_2$ (step S4).

Figure 7:
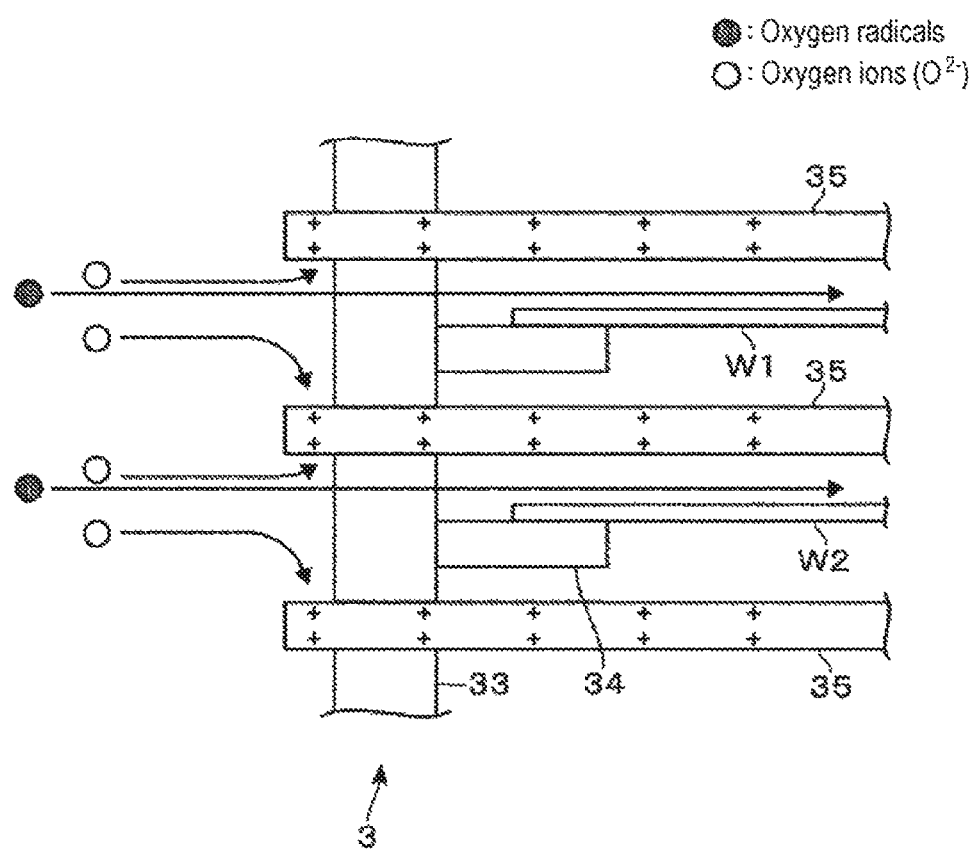
FIG. 7 is a side view of a wafer boat accommodated in the film forming apparatus.

In addition, the ring plate 35 is polarized, and a positive or negative electric charge is present on the surface thereof. The peripheral edge portion of the ring plate 35 is positioned closer to the plasma forming space 14 than the peripheral edge portion of the wafer W. Therefore, among the oxygen ions supplied from the plasma forming space 14 to the processing space 13 without being deactivated, the ions having a polarity opposite to that of the electric charge existing on the surface of the ring plate 35 are attracted to and collided with the ring plate 35, whereby the electric charge is neutralized and becomes inactive. In the schematic view of FIG. 7, there is shown an example in which the ring plate 35 has a positive electric charge and attracts the oxygen ions ($O_2^-$) having a negative polarity. If the ring plate 35 has a negative electric charge, the oxygen ions ($O_2^+$) having a positive polarity are attracted to the ring plate 35. As the oxygen ions are attracted by the ring plate 35 in this way, the oxygen ions are more reliably prevented from being supplied to the peripheral edge portions of the wafers W1 and W2.

When a predetermined time, for example, 50 seconds to 100 seconds, elapses from time t6 at which the plasma processing is started, the high-frequency power source 44 is turned off. The discharge of the $O_2$ gas from the second gas nozzle 62 is stopped, and the purge gas is discharged from the first gas nozzle 52 and the second gas nozzle 62. The $O_2$ gas and the active species thereof remaining in the processing container 11 are purged, and the interior of the processing container 11 is replaced by the $N_2$ gas atmosphere. That is to say, step S1 is performed again.

Figure 8A:
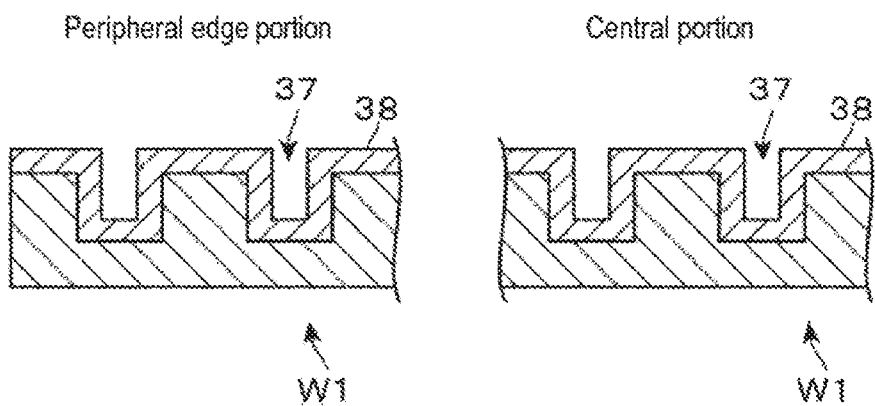
FIGS. 8A and 8B are vertical sectional side views of wafers held in the wafer boat.
Figure 8B:
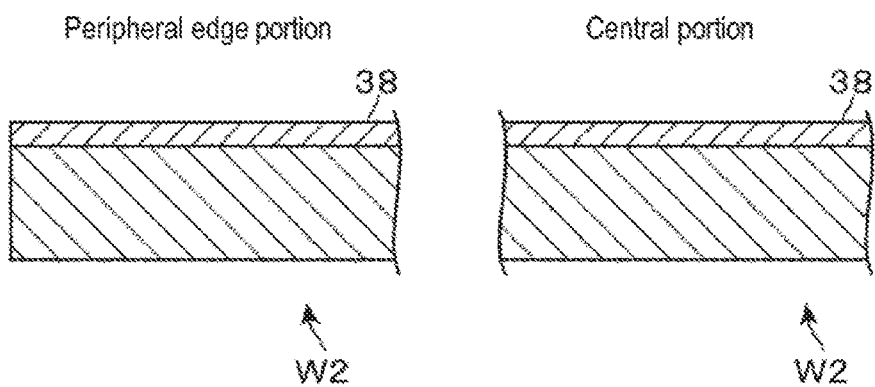

Thereafter, steps S2 to S4 are performed. After step S4 are completed, steps S1 to S4 are further performed. By repeating steps S1 to S4 in this manner, a thin layer of $SiO_2$ is deposited, a $SiO_2$ film 38 is formed, and the film thickness is increased. Even in step S4 repeatedly performed in this way, as described above, the supply of the oxygen ions to the peripheral edge portion of the wafers W1 and W2 is suppressed. On the other hand, oxygen radicals are sufficiently supplied to the entire surfaces of the wafer W1 and the wafer W2. Therefore, the excessive supply of the active species of the plasma to the peripheral edge portion of the wafer W is suppressed. Particularly, in the peripheral edge portion of the wafer W2 having a small surface area per predetermined area, the progress of a decrease in the film thickness due to the modification of the $SiO_2$ film 38 is suppressed. In addition, the shortage of the amount of the active species required for the oxidation of the source gas adsorbed onto the entire surface of the wafer W is suppressed. As a result, as shown in FIGS. 8A and 8B, the $SiO_2$ film 38 grows so that the film thickness becomes uniform between the central portion and the peripheral edge portion in both of the wafers W1 and W2. When the interior of the processing container 11 is purged after steps S1 to S4 are repeatedly performed a predetermined number of times, the supply of the respective gases into the processing container 11 and the rotation of the wafer boat 3 are stopped. The lid 22 is lowered, and the wafer boat 3 is unloaded from the processing container 11.

According to the film forming apparatus 1, on the outer side of the plasma forming box 41 constituting the protrusion portion formed by expanding the side peripheral wall of the processing container 11 outward, the antenna 42 for forming the ICP in the plasma forming box 41 is provided along the plasma forming box 41. In the left and right side walls of the plasma forming box 41, there is provided the shield 7 including the main plates 71 respectively extending from the front side of the antenna 42 to the left and right sides. By the shield 7, the conversion of the $O_2$ gas into plasma is suppressed in the processing space 13 and on the front side of the plasma forming box 41. It is therefore possible to reduce the supply amount of the oxygen ions as the active species to the wafer W. Furthermore, by the antenna 42 described above, the plasma of relatively high intensity can be formed inside the plasma forming box 41. Thus, a large amount of oxygen radicals can be generated and can be supplied so as to spread over the entire surfaces of the wafers W1 and the wafers W2. Accordingly, the $SiO_2$ film can be formed so that both of the wafers W1 and W2 have a uniform film thickness in the plane of the wafer W.

Figure 9:
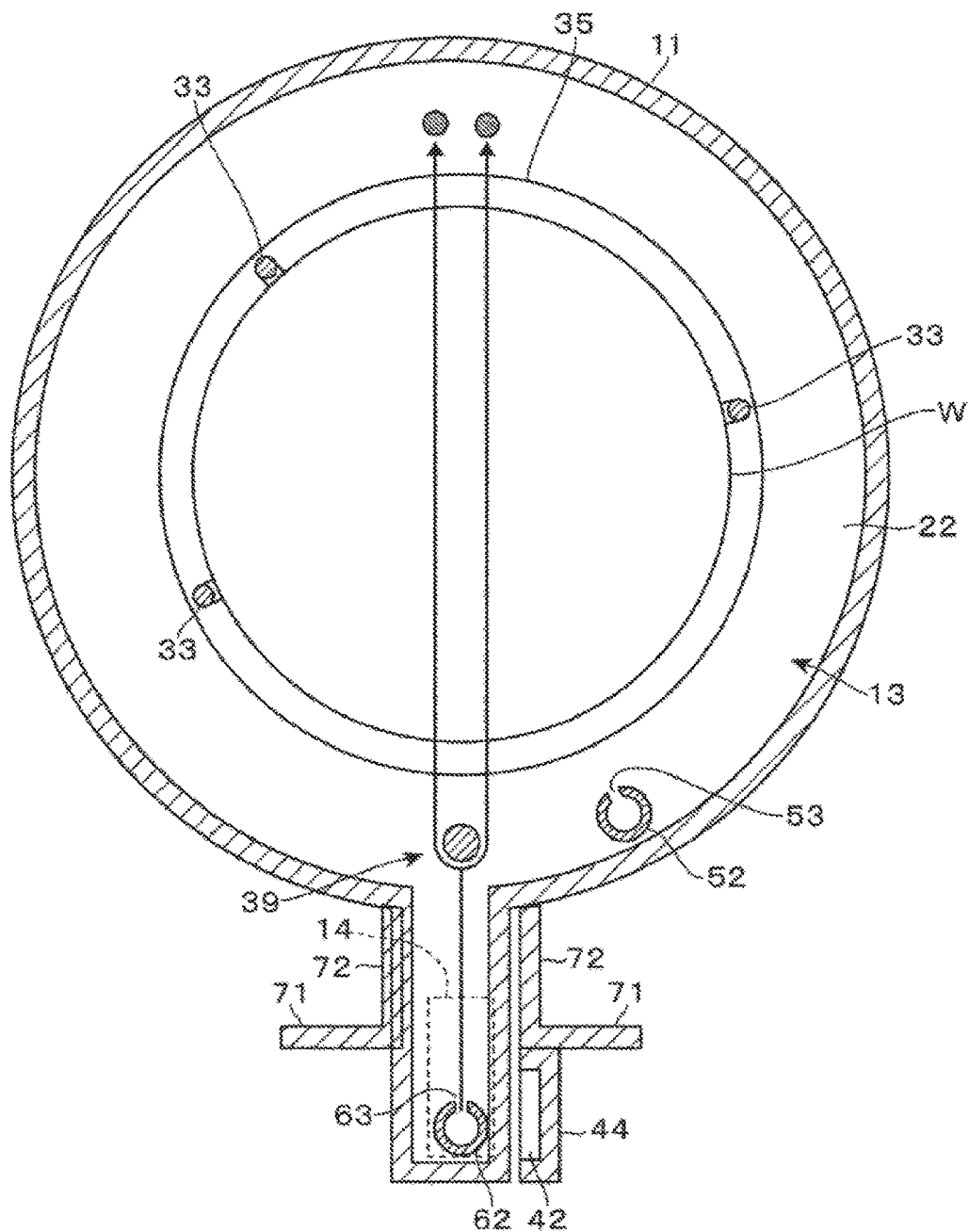
FIG. 9 is a horizontal sectional plan view of another film forming apparatus.

Incidentally, the ring plates 35 as attraction portions may be dielectric bodies capable of having electric charges on their surfaces. Therefore, the material of the ring plates 35 is not limited to quartz but may be, for example, ceramics. Since a semiconductor may also have an electric charge on the surface thereof, the ring plates 35 may be made of a semiconductor such as silicon or the like. Moreover, the shape of the attraction portions is not limited to a ring shape. For example, instead of the ring plates 35, circular plates without having the opening 36 may be provided in the wafer boat 3. Furthermore, the attraction portions are not limited to being provided in the wafer boat 3, as long as it is located between the plasma forming space 14 and the wafers W. For example, as shown in FIG. 9, a quartz pillar 39 extending vertically from the lid 22 may be provided in a region between the plasma forming space 14 and the wafer boat 3 in the processing space 13. Ions may be attracted by the pillar 39. Furthermore, the ring plates 35 are not limited to being provided alternately with the slots. A plurality of ring plates 35 may be provided continuously in the vertical direction or may be provided one by one for each of a plurality of slots. However, in order to improve the uniformity of processing among the wafers W, it is preferable to provide the ring plates 35 alternately with the slots as in the above-described configuration example.

In the above-described example, the antenna 42 is provided on the right side of the plasma forming box 41 as viewed from the back side toward the front side. However, it will suffice that the antenna 42 is provided in the plasma forming box 41 so that the ICP can be formed. Accordingly, the antenna 42 may be provided on the left side or the back side of the plasma forming box 41. Further, as long as it is possible to form the ICP, the antenna 42 may be provided slightly away from the plasma forming box 41. Moreover, although the main plates 71 and the sub plates 72 are integrally formed in the above-described example, they may not be integrally formed as such. In addition, the sub plate 72 may be provided away from the side wall of the plasma forming box 41 or may be provided away from the main plates 71.

The film forming apparatus 1 performs a film forming process on the wafer W at a room temperature. In other words, the wafer W is not heated during the film forming process. However, for example, a heater may be provided outside the processing container 11, and the film forming process may be performed by heating the wafer W to a predetermined temperature. The film forming process is not limited to the formation of the $SiO_2$ film. For example, in the above example, an $NH_3$ (ammonia) gas may be used as the process gas instead of $O_2$. By converting the $NH_3$ gas into plasma and supplying the plasma to the wafer W, the ALD process may be performed to form a SiN (silicon nitride) film on the wafer W. In such a case as well, it is possible to suppress the supply of ions to the peripheral edge portion of the wafer W and to perform a process by supplying the electrically neutral radicals to the entire wafer W. As described above, the process gas is not limited to oxygen. Although the plasma ALD process has been described as an example of the plasma process, the present disclosure is not limited thereto. The present disclosure may be applied to various processes using plasma, such as a plasma CVD (Chemical Vapor Deposition) process, a plasma reforming process, a plasma etching process performed in the evaluation tests to be described later, and the like. In addition, the above-described embodiments may be appropriately changed or combined.

(Evaluation Test)

Evaluation tests conducted in connection with the present disclosure will be described.

Evaluation Test 1

In evaluation test 1, $SiO_2$ films were formed on the wafers W in accordance with the above-described procedure using the film forming apparatus 1. The film thicknesses were measured at a plurality of locations with respect to the wafers W2 respectively disposed in the top part, the center part and the bottom part of the wafer boat 3. Then, the average value of the film thicknesses in the planes of the wafers W2, the uniformity of the film thicknesses in the planes of the wafers W2 (hereinafter referred to as in-plane uniformity), the uniformity of the film thicknesses between the planes of the wafers W2 (hereinafter referred to as inter-plane uniformity) were calculated. The in-plane uniformity and the inter-plane uniformity were calculated as ±(maximum value of film thickness−minimum value of film thickness)/(average value of film thickness)×100/2 (unit: %). Therefore, as for the in-plane uniformity of the film thicknesses, the smaller the absolute value means that the smaller the variation in the film thicknesses in the planes of the wafers W. As for the inter-plane uniformity of the film thicknesses, the smaller the absolute value means that the smaller the variation in the film thicknesses between the wafers W for which the film thicknesses are measured. Hereinafter, there may be a case where the wafers W held in the top part, the center part and the bottom part of the wafer boat 3 are referred to as T, C and B, respectively.

The film formation of the $SiO_2$ film in evaluation test 1 was carried out a plurality of times while changing the plasma processing time (i.e., the time from time t6 to time t7 in the above process). Specifically, the plasma processing time was set to 50 seconds, 65 seconds, and 100 seconds, respectively. In evaluation test 1, the tests in which the plasma processing time is set to 50 seconds, 65 seconds, and 100 seconds are defined as evaluation tests 1-1, 1-2, and 1-3, respectively.

Figure 10:
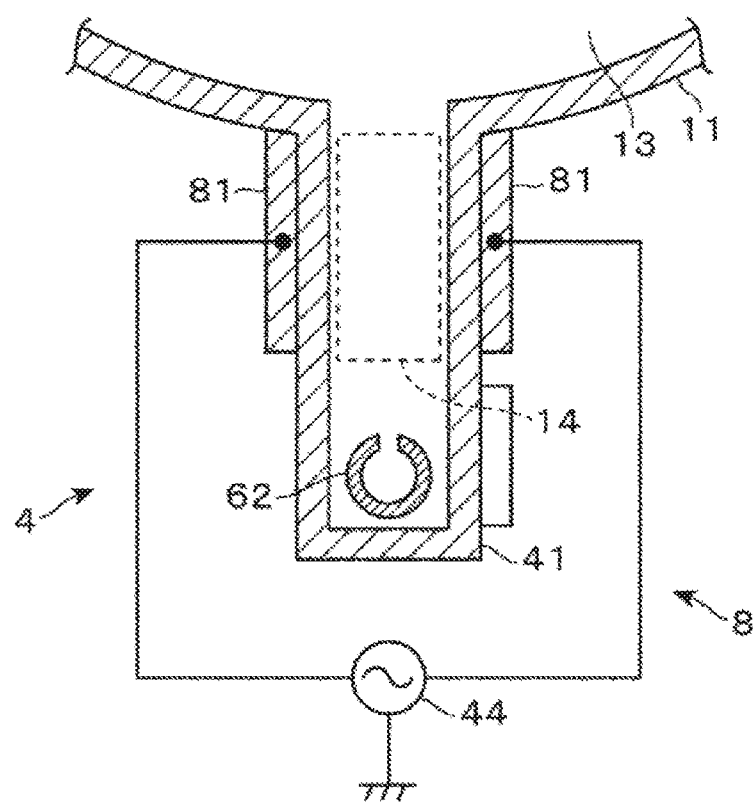
FIG. 10 is a horizontal sectional plan view of a film forming apparatus of a comparative example.

Further, comparative test 1 was performed using a film forming apparatus 8, which is different from the film forming apparatus 1 in the configuration of the plasma forming part 4, and a wafer boat having a configuration different from that of the wafer boat 3. As shown in FIG. 10, the plasma forming part 4 of the film forming apparatus 8 is provided with electrodes 81 facing each other on the left and right sides of the plasma forming box 41 and is configured so that a high frequency power is supplied from the high-frequency power source 44 to the respective electrodes 81. If the high frequency power is supplied in this way, capacitively coupled plasma (CCP) is formed in the plasma forming space 14 sandwiched between the respective electrodes 81 in the plasma forming box 41. In addition, the shield 7 is not provided in the plasma forming part 4 of the film forming apparatus 8.

The ring boat used in comparative test 1 is different from the above-mentioned wafer boat 3 in that the ring plates 35 are not provided and further that the number of slots is larger than that of the wafer boat 3. The process was performed by mounting 100 wafers W. Even in comparative test 1, the plasma processing time is changed each time when the film forming process is carried out. Tests in which the plasma processing time is set to 50 seconds and 100 seconds are defined as comparative tests 1-1 and 1-2, respectively.

Figure 11:
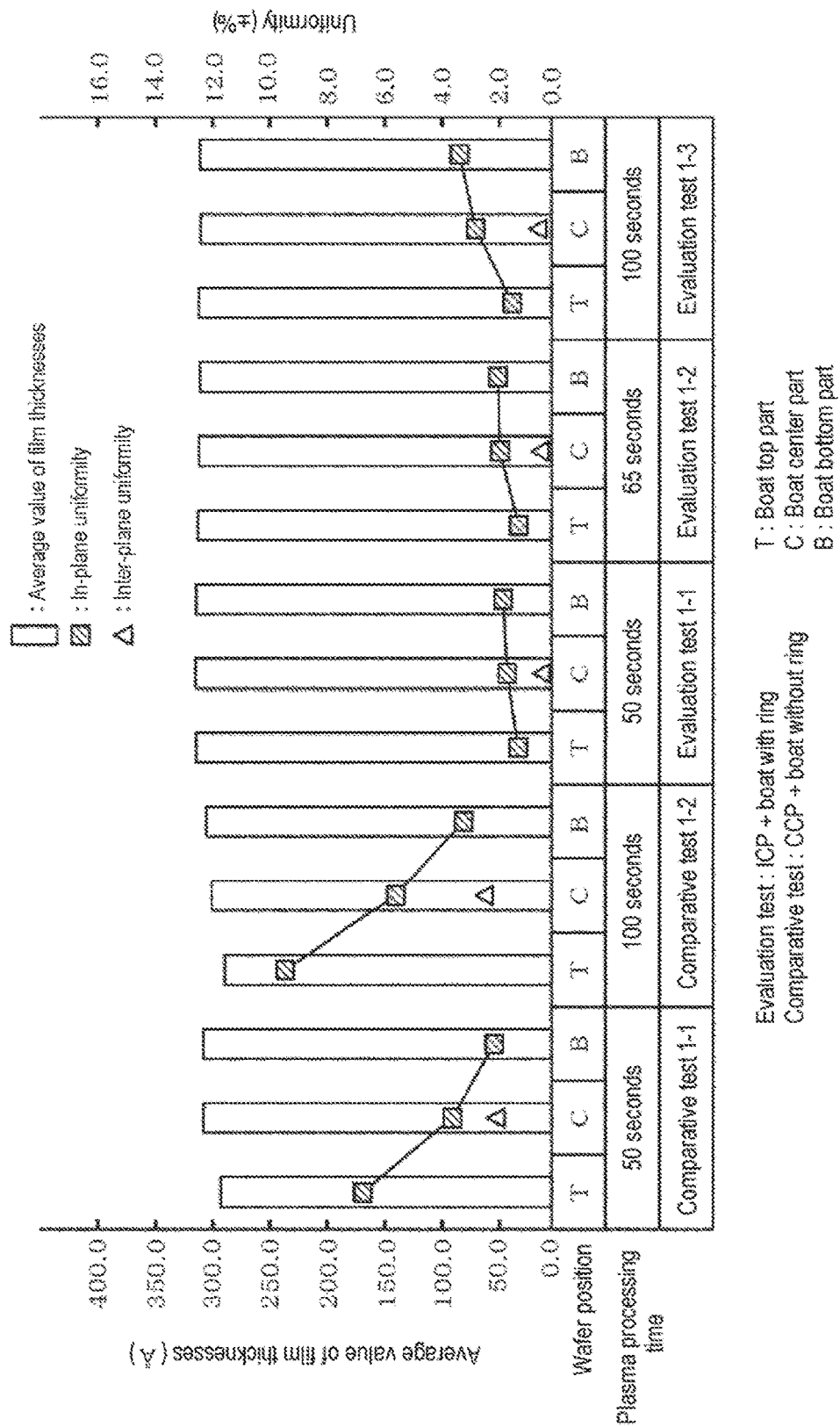
FIG. 11 is a graph showing the results of evaluation tests.

The graph of FIG. 11 shows the results of evaluation test 1 and comparative test 1. The vertical axis of the graph indicates the average value (unit: Å) of the film thicknesses and the uniformity (unit: %) of the film thickness. This uniformity includes the in-plane uniformity and the inter-plane uniformity described above. The histogram shows the average value of the film thicknesses, the square plot shows the in-plane uniformity, and the triangle plot shows the inter-plane uniformity. As for T. C and B of evaluation test 1-1, the average value of the film thicknesses was 323.0 Å, 322.0 Å and 320.4 Å, and the in-plane uniformity was 1.3%, 1.6% and 1.8%. Further, the inter-plane uniformity of evaluation test 1-1 was 0.4%. As for T, C and B of evaluation test 1-2, the average value of the film thicknesses was 320.4 Å, 317.8 Å and 317.9 Å, and the in-plane uniformity was 1.2%6, 1.9% and 2.0%. The inter-plane uniformity of evaluation test 1-2 was 0.4%. As for T, C and B of evaluation test 1-3, the average value of the film thicknesses was 319.5 Å, 316.7 Å and 316.1 Å, and the in-plane uniformity was 1.4%, 2.8% and 3.4%. The inter-plane uniformity of evaluation test 1-3 was 0.5%.

As for T, C and B of comparative test 1-1, the average value of the film thicknesses was 302.1 Å, 313.6 Å and 315.5 Å, and the in-plane uniformity was 6.8%, 3.6% and 2.2%. The inter-plane uniformity of comparative test 1-1 was 2.2%. As for T, C and B of comparative test 1-2, the average value of the film thicknesses was 296.9 Å, 305.8 Å, 312.1 Å, and the in-plane uniformity was 9.7%, 5.7% and 3.3%. The inter-plane uniformity of comparative test 1-2 was 2.5%.

As described above, in evaluation test 1 and comparative test 1, if the plasma processing time is prolonged, the in-plane uniformity and the inter-plane uniformity are lowered. However, when comparing evaluation test 1-3 and comparative test 1-2 where the plasma processing time is the same 100 seconds, evaluation test 1-3 shows better in-plane uniformity and inter-plane uniformity. Presumably, this is because the supply of the oxygen ions to the peripheral edge portion of the wafer W is suppressed by the ring plate 35 as described in the embodiments of the present disclosure.

Evaluation Test 2

In evaluation test 2, similar to evaluation test 1 described above, a film forming process was performed on the wafers W. A loading effect (unit: %) serving as an index of the film formation state on the wafers W1 and the wafers W2 was calculated from the wafers W1 and the wafers W2 subjected to the film formation. In evaluation test 2, the loading effect (%)=(film thickness of $SiO_2$ film of wafer W2−film thickness of $SiO_2$ film of wafer W1)/film thickness of $SiO_2$ film of wafer W2)×100. Accordingly, as the value of the loading effect grows smaller, it means that the $SiO_2$ film is formed with higher uniformity between the wafers W1 and the wafer W2. In evaluation test 2, as the wafers W1 to be mounted on the wafer boat 3, the wafers whose surface area on the front surface side thereof are 30 times as large as the surface area on the front surface side of the wafers W2 were used. The plasma processing time was changed each time when the film forming process is performed. The thickness L1 of the main plates 71 and the sub plates 72 of the shield 7 of the film forming apparatus 1 used in evaluation test 2 is 2 mm.

In comparative test 2-1, the same test as evaluation test 2 was conducted, except that the film forming apparatus 8 for performing the plasma processing with the aforementioned CCP was used. Further, in comparative test 2-2, the same test as evaluation test 2 was conducted using a film forming apparatus configured substantially in the same manner as the film forming apparatus 1 and configured to perform the plasma processing with the ICP. However, in the shield 7 of the film forming apparatus used in comparative test 2-2, the main plate 71 and the sub plate 72 are provided only on the right side when viewed from the back side toward the front side. The main plate 71 and the sub plate 72 are not provided on the left side. The thickness L1 of the main plate 71 and the sub plate 72 of comparative test 2-2 is 3 mm.

Figure 12:
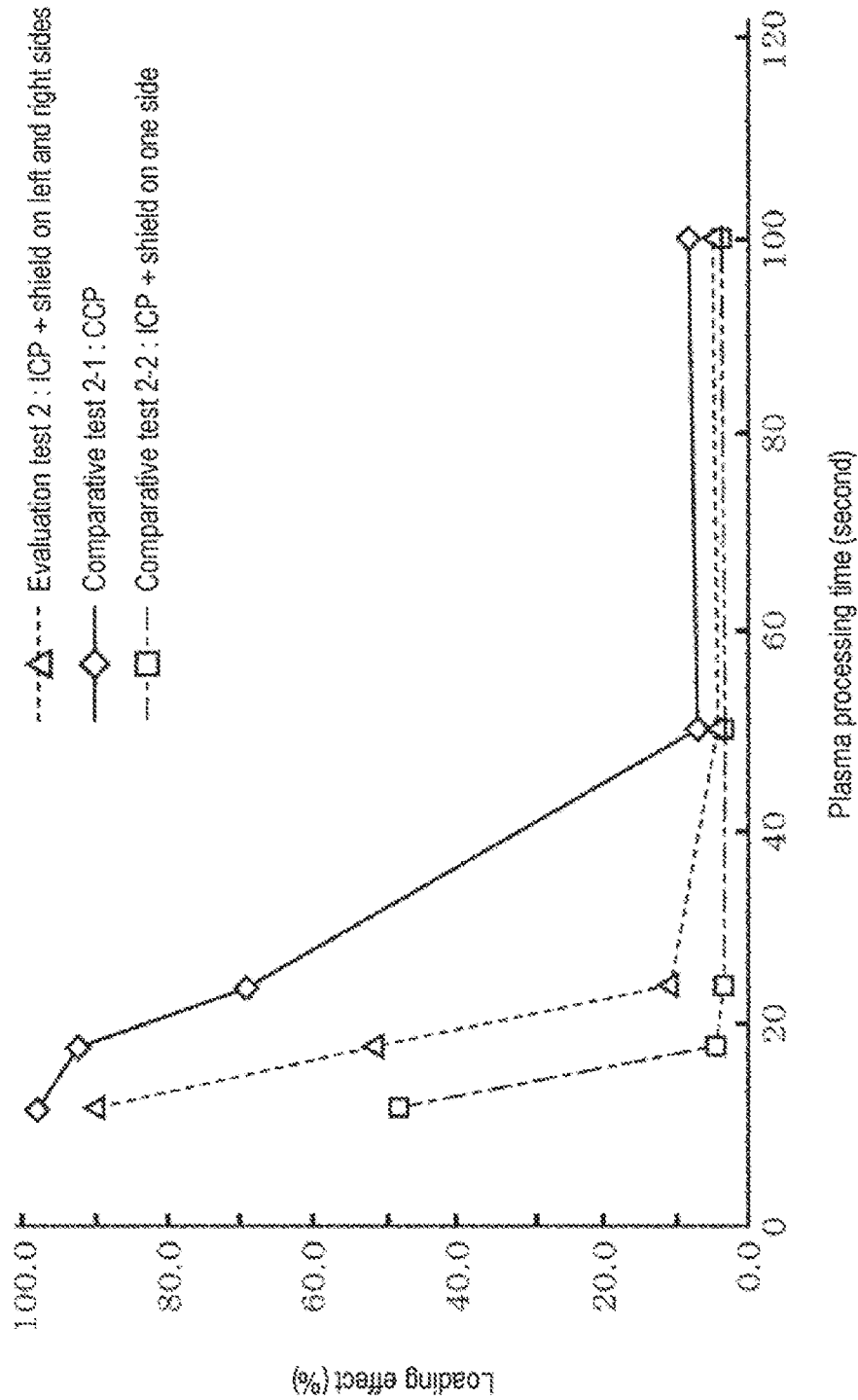
FIG. 12 is a graph showing the results of evaluation tests.

The graph of FIG. 12 shows the results of evaluation test 2 and comparative tests 2-1 and 2-2. The vertical axis of the graph shows the loading effect (unit: %), and the horizontal axis of the graph shows the plasma processing time (unit: second). When the plasma processing time is 50 seconds or more, there is no great difference in the loading effect between evaluation test 2, comparative test 2-1, and comparative test 2-2. However, if the plasma processing time is shorter than 50 seconds, the loading effect of evaluation test 2 and comparative test 2-2 is smaller than the loading effect of comparative test 2-1. That is to say, in evaluation test 2 and comparative test 2-2, it can be noted that a larger amount of the active species are supplied to the wafers W and a reaction is performed. Accordingly, in order to suppress the loading effect and to reliably performing the film formation on the wafers W1, it is advantageous to form the ICP and to perform the processing by providing the antenna 42 as described in the embodiments of the present disclosure. As compared with evaluation test 2, the loading effect is improved in comparative test 2-2. However, by providing the main plates 71 and the sub plates 72 on the left and right sides of the plasma forming box 41 as in evaluation test 2, it is possible to more reliably shield the electric field and to more reliably suppress the supply of ions to the peripheral edge portions of the wafers as described in the embodiments of the present disclosure. From the viewpoint of obtaining the high film thickness uniformity, it is preferable to construct the apparatus as in evaluation test 2.

Evaluation Test 3

In evaluation test 3, a film forming process was performed in the same manner as in evaluation test 1. The average value of the film thicknesses, the in-plane uniformity and the inter-plane uniformity for the wafers W2 were acquired. In comparative test 3-1, a test was conducted in the same manner as in evaluation test 3, except that a film forming process is performed by mounting the wafers W on a wafer boat not provided with the ring plates 35 similar to those used in comparative test 1. In comparative test 3-2, a test was conducted in the same manner as in comparative test 3-1, except that the film forming process was performed using the film forming apparatus 8.

Figure 13:
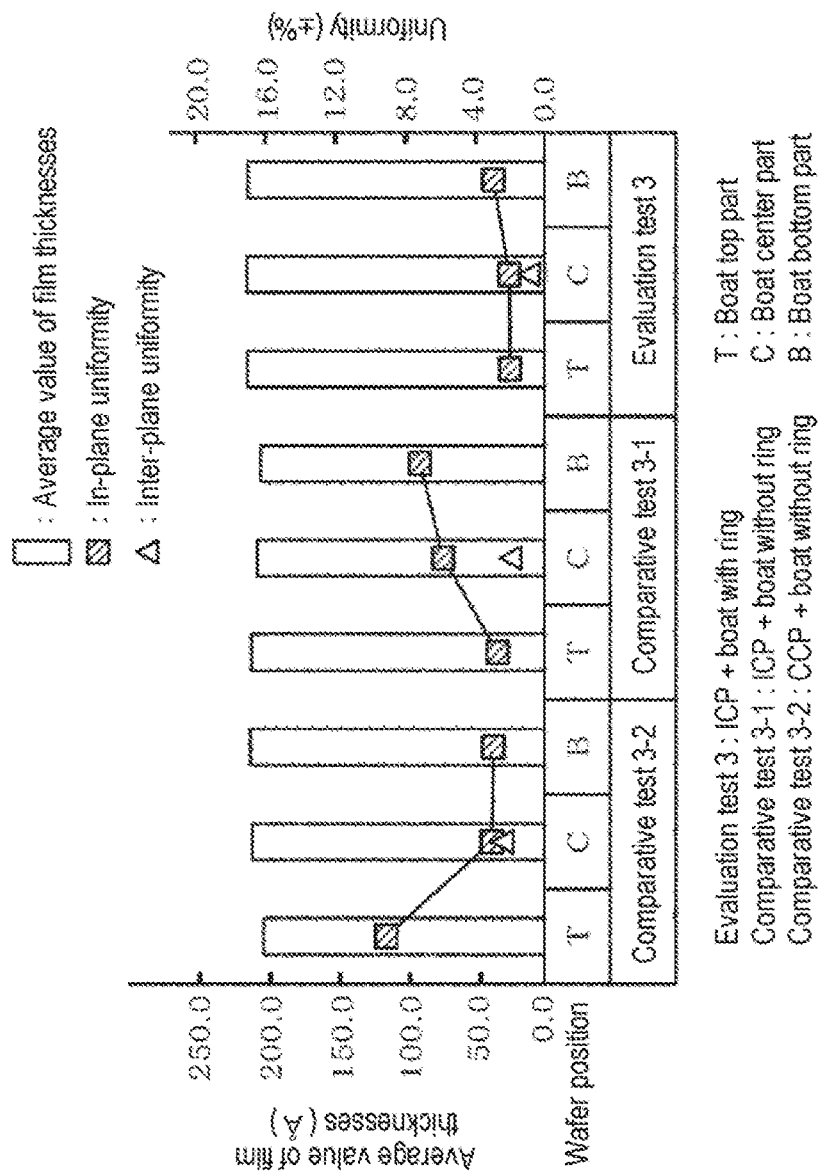
FIG. 13 is a graph showing the results of evaluation tests.

The graph of FIG. 13 shows the results of evaluation test 3 and comparative tests 3-1 and 3-2 as in the graph of FIG. 11. As for T, C and B of evaluation test 3, the average value of the film thicknesses was 214.5 Å, 213.9 Å and 212.1 Å, and the in-plane uniformity was 1.8%, 2.0% and 3.1%. The inter-plane uniformity of evaluation test 3 was 0.6%. As for T, C and B of comparative test 3-1, the average value of the film thicknesses was 211.0 Å, 206.9 Å and 204.1 Å, and the in-plane uniformity was 2.6%, 5.8% and 7.1%. The inter-plane uniformity of comparative test 3-1 was 1.7%. As for T. C and B of comparative test 3-2, the average value of the film thicknesses was 201.9 Å, 211.1 Å and 212.0 Å, and the in-plane uniformity was 9.1%, 2.9% and 2.8%. The inter-plane uniformity of comparative test 3-2 was 2.4%.

Figure 14:
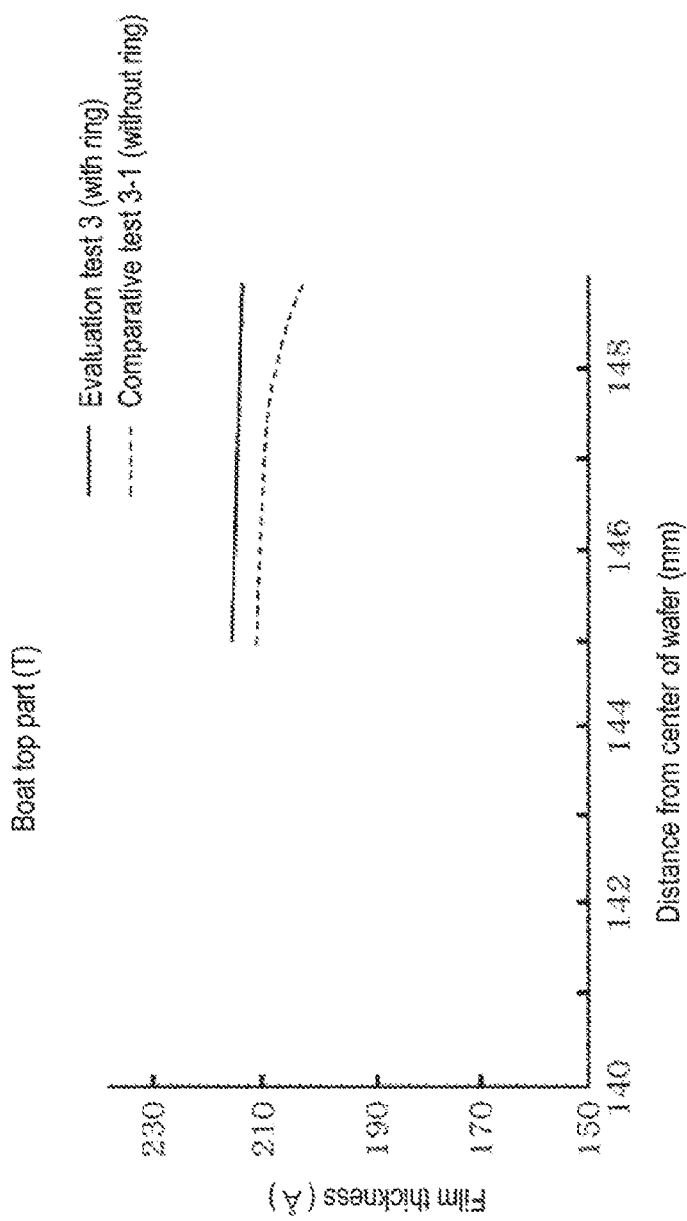
FIG. 14 is a graph showing the results of evaluation tests.
Figure 15:
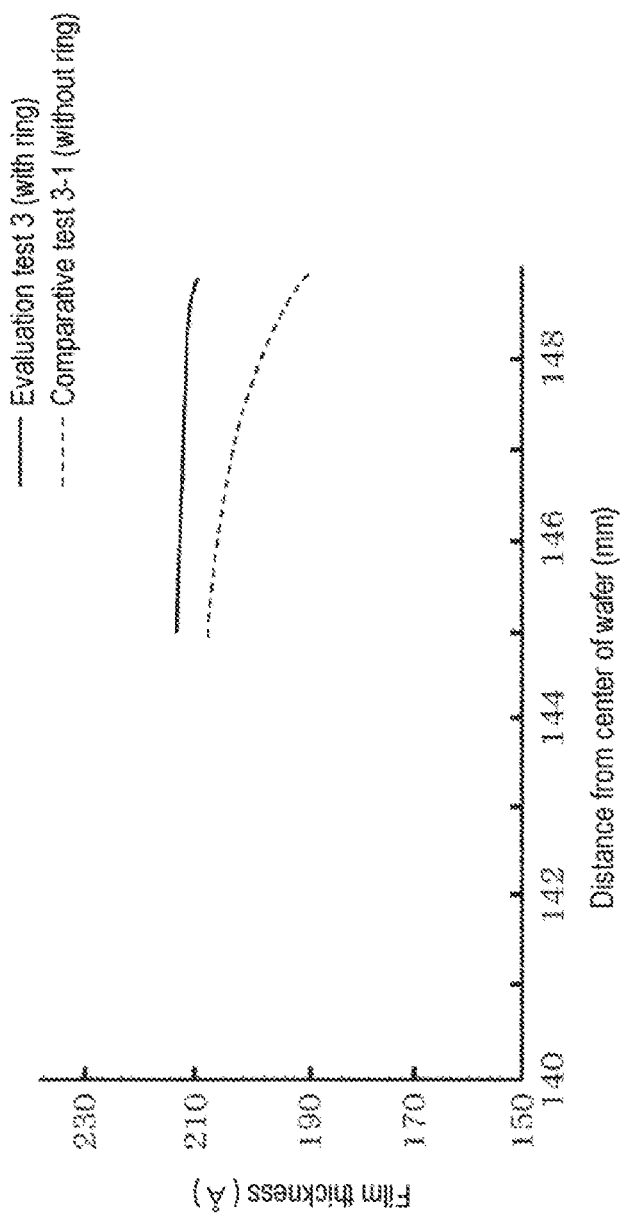
FIG. 15 is a graph showing the results of evaluation tests.
Figure 16:
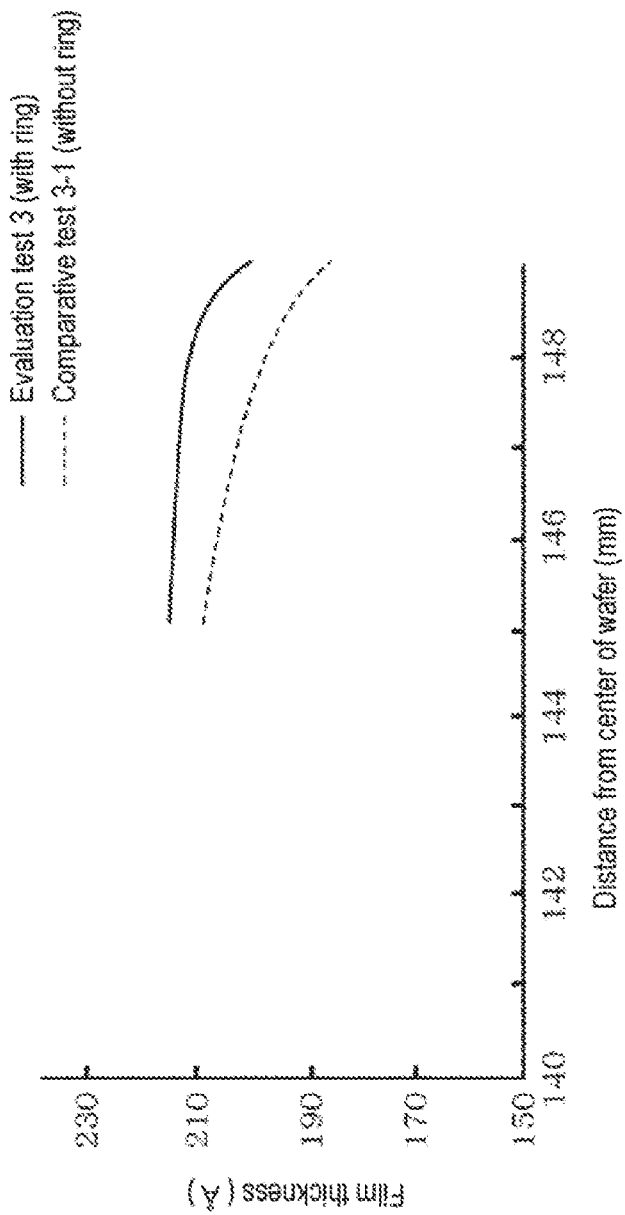
FIG. 16 is a graph showing the results of evaluation tests.

By the way, the graph of FIG. 14 shows the film thickness distribution in the peripheral edge portion of the wafer W2 at the position T in evaluation test 3 and comparative test 3-1. The graph of FIG. 15 shows the film thickness distribution in the peripheral edge portion of the wafer W2 at the position C in evaluation test 3 and comparative test 3-1. The graph of FIG. 16 shows the film thickness distribution in the peripheral edge portion of the wafer W2 at the position B in evaluation test 3 and comparative test 3-1. The horizontal axis of each graph represents the distance (unit: mm) from the center of the wafer W, and the vertical axis of each graph represents the film thickness (A). In each graph, the film thickness distribution of evaluation test 3 is indicated by a solid line, and the film thickness distribution of comparative test 3-1 is indicated by a dotted line.

As shown in the graphs of FIGS. 14 to 16, in evaluation test 3, the decrease in the film thickness on the peripheral edge side of the wafer is suppressed as compared with comparative test 3-1. As shown in the graph of FIG. 13, as for the in-plane uniformity and the inter-plane uniformity, evaluation test 3 shows a lower value than comparative test 3-1, and comparative test 3-1 shows a lower value than comparative test 3-2. Accordingly, it is possible to improve the in-plane uniformity and the inter-plane uniformity by forming the ICP rather than forming the CCP. In the case of forming the ICP, by providing the ring plates 35, it is possible to suppress the decrease in the film thickness in the peripheral edge portion of the wafer W2 and to improve the in-plane uniformity and the inter-plane uniformity.

Evaluation Test 4

In evaluation test 4, a SiO₂ film formed on the wafer mounted on the wafer boat 3 was etched using an etching apparatus configured substantially in the same manner as the film forming apparatus 1. The etching apparatus was configured so that, in place of the O₂ gas, an etching gas obtained by vaporizing hydrofluoric acid diluted to 0.125 volume % with water can be supplied from the second gas nozzle 62. Then, the processing was performed by converting the etching gas into plasma and supplying the plasma the wafer W for 60 seconds. After the processing, as for the respective wafers W2 of T, C and B, the etching rate ratios in the central portion and in the peripheral edge portion were measured. The etching rate ratio in the central portion was calculated as a ratio in the case where the etching rate in the central portion of the wafer W when the plasma processing is performed by supplying an oxygen-containing gas to the wafer W in place of the hydrofluoric acid is assumed to be 1. The etching rate ratio in the peripheral edge portion was calculated as a ratio in the case where the etching rate in the peripheral edge portion of the wafer W when the plasma processing is performed by supplying the oxygen-containing gas to the wafer W is assumed to be 1. In comparative test 4-1, the same test as evaluation test 4 was conducted, except that the wafer W was mounted on a wafer boat not provided with the ring plates 35 similar to those used in comparative test 1. In comparative test 4-2, the same test as comparative test 4-1 was conducted, except that the plasma formation was performed by forming the CCP as in the film forming apparatus 8 described above.

Figure 17:
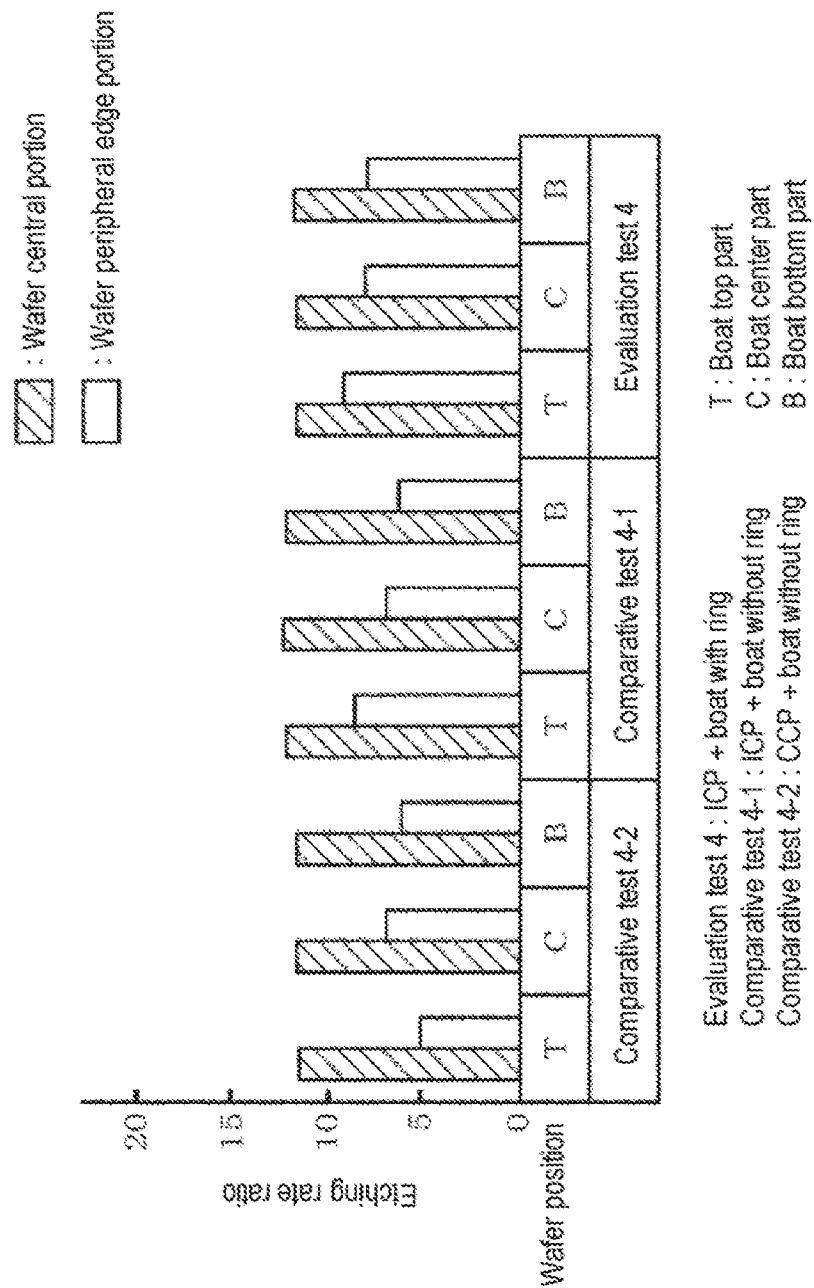
FIG. 17 is a graph showing the results of evaluation tests.

The graph of FIG. 17 shows the results of evaluation test 4 and comparative tests 4-1 and 4-2. The vertical axis of the graph shows the etching rate ratio. In evaluation test 4, the difference between the etching rate ratio in the central portion of the wafer W and the etching rate ratio in the peripheral edge portion of the wafer W is small as compared with comparative tests 4-1 and 4-2. Presumably, this is because the supply of ions to the wafer W is suppressed by the ring plate 35 as described above. Accordingly, the effect of the ring plate 35 was also confirmed from evaluation test 4 and comparative tests 4-1 and 4-2. When comparative test 4-1 and comparative test 4-2 are compared, comparative test 4-1 has a larger value of the etching rate ratio in both the central portion and the peripheral edge portion of the wafer W than comparative test 4-2. Therefore, it is considered that a larger amount of the active species is generated in comparative test 4-1 which forms the ICP than in comparative test 4-2 which forms the CCP. Accordingly, in order to process the wafer W having a large surface area like the wafer W1 described above, it is advantageous to perform the processing by forming the ICP.

Evaluation Test 5

In evaluation test 5-1, the film formation was performed three times using the film forming apparatus 1. From the wafers W2 mounted in the respective slots of the wafer boat 3 and subjected to the film formation at the respective times, the average value of the film thicknesses, the in-plane uniformity and the inter-plane uniformity were calculated in the same manner as in evaluation test 1. In evaluation test 5-1, the average value of the film thicknesses, the in-plane uniformity and the inter-plane uniformity were calculated not only for the wafers W2 disposed in the respective slots of the top part (T), the center part (C) and the bottom part (B) of the wafer boat 3, but also for the wafers W2 disposed in the slots between the top part and the center part (referred to as TC) and the wafers W2 disposed in the slots between the center part and the bottom part (referred to as CB). In addition, in evaluation test 5-1, a film forming process was performed using the shield 7 in which L1, L2, and L3 described in FIG. 2 are 3 mm, 25 mm, and 8 mm, respectively.

In evaluation test 5-2, a test was conducted in the same manner as in evaluation test 5-1 to calculate the average value of the film thicknesses, the in-plane uniformity and the inter-plane uniformity of the wafers W2. However, in evaluation test 5-2, a film forming process was performed using the shield 7 having L1 of 2 mm, L2 of 25 mm and L3 of 17 mm. In comparative test 5, similar to comparative test 2-1, the film forming process was performed once using the film forming apparatus including the shield 7 in which the main plate 71 and the sub plate 72 are not provided on the left side of the connecting portion 73 when viewed from the back side toward the front side. The average value of the film thicknesses, the in-plane uniformity and the inter-plane uniformity of the wafers W2 were calculated. In the shield 7, L1 is 2 mm and L2 is 25 mm.

Figure 18:
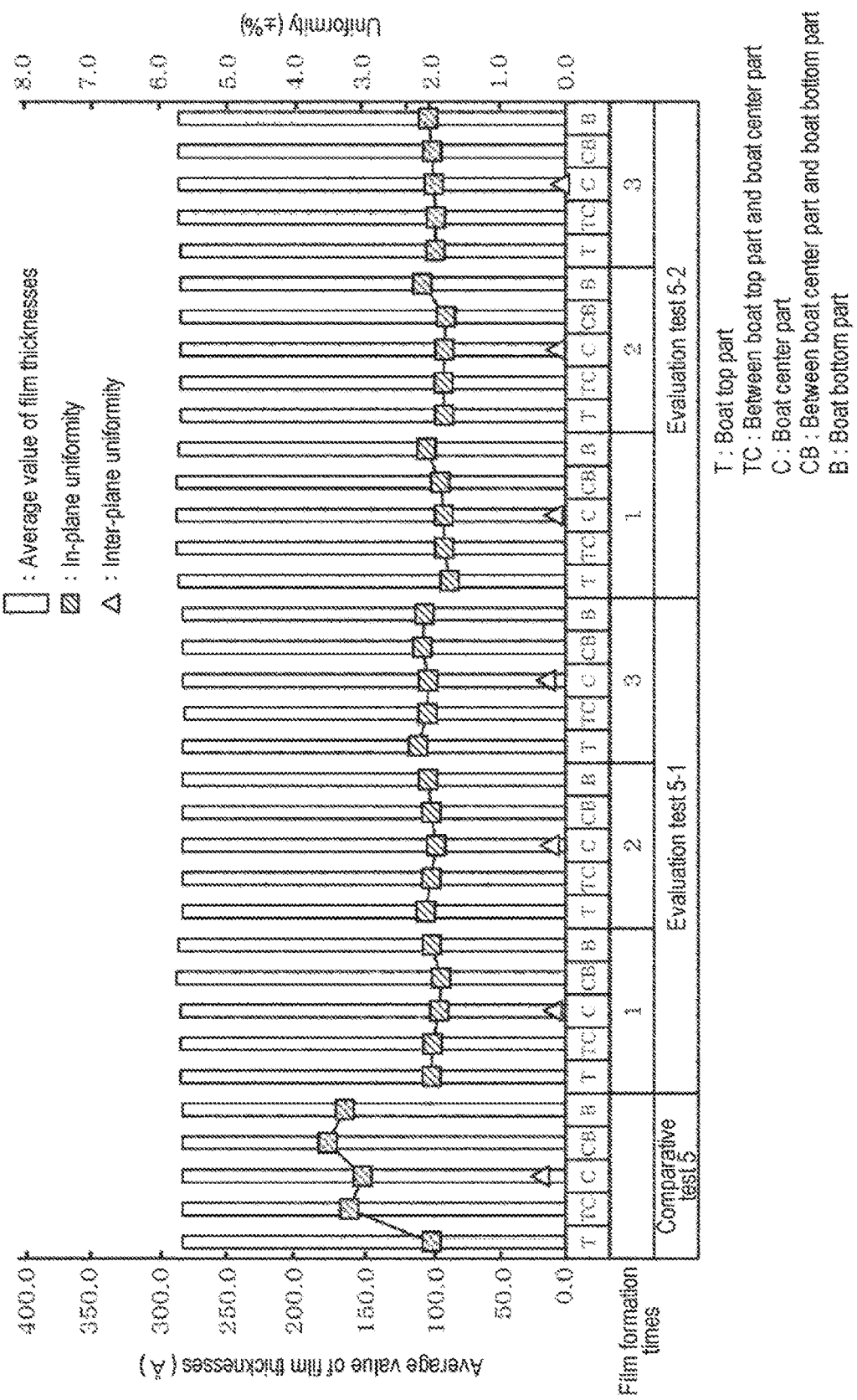
FIG. 18 is a graph showing the results of evaluation tests.

The graph of FIG. 18 shows the results of evaluation test 5-1, evaluation test 5-2, and comparative test 5 as in the graph of FIG. 11. The respective values obtained in the first film forming process of evaluation test 5-1 are as follows. As for T, TC, C, CB and B, the average value of the film thicknesses was 282.6 Å, 282.7 Å, 283.3 Å, 283.8 Å and 283.4 Å, and the in-plane uniformity was 1.96%, 1.94%, 1.84%, 1.83% and 1.99%. In addition, the inter-plane uniformity in the first film forming process of evaluation test 5-1 was 0.21%. The respective values obtained in the first film forming process of evaluation test 5-2 are as follows. As for T, TC, C, CB and B, the average value of the film thicknesses was 284.6 Å, 284.7 Å, 284.8 Å, 285.1 Å and 284.3 Å, and the in-plane uniformity was 1.73%6, 1.79%, 1.76%, 1.85% and 2.04%. Further, the inter-plane uniformity in the first film forming process of evaluation test 5-2 was 0.14%. As shown in the graph, in evaluation tests 5-1 and 5-2, the average value of the film thicknesses, the in-plane uniformity and the inter-plane uniformity obtained in the second and third film forming processes did not show significant differences from the respective values obtained in the first film forming process.

The respective values obtained in the film forming process of comparative test 5 are as follows. As for T, TC, C, CB and B, the average value of the film thicknesses was 282.1 Å, 280.8 Å, 279.8 Å, 280.0 Å and 279.9 Å, and the in-plane uniformity was 1.98%, 3.17%, 2.99%, 3.48% and 3.23%. In addition, the inter-plane uniformity was 0.41%.

As described above, in evaluation tests 5-1 and 5-2 and comparative test 5, the film formation was performed with approximately the same film thickness. However, the in-plane uniformity and the inter-plane uniformity were better in evaluation tests 5-1 and 5-2 than in comparative test 5. Presumably, this is because, as described in the embodiments of the present disclosure, the electric field is more largely shielded in evaluation tests 5-1 and 5-2 than in comparative test 5, which makes it possible to suppress the action of ions. The effects of the present disclosure could be noted from such a result of evaluation test 5.

In addition, when the result of evaluation test 5-1 and the result of evaluation test 5-2 are compared, the in-plane uniformity and the inter-plane uniformity were better in evaluation test 5-2 than in evaluation test 5-1. From these results, it is considered that, in order to largely shield the electric field and to obtain higher film thickness uniformity, it is effective to make the L3 shown in FIG. 2 relatively long. In evaluation tests 5-1 and 5-2, the shield 7 having L3 shorter than L2 was used. However, it is considered that the electric field can be largely shielded by increasing the length L3 as described above. Therefore, it is considered that even if L3 is set equal to or larger than L2, it is possible to obtain better in-plane uniformity and better inter-plane uniformity.

The shield 7 described with reference to FIGS. 1 and 5 and the like is configured such that in the respective left and right side walls of the plasma forming box 41, the main plates 71 and the sub plates 72 are provided in a region spanning the entirety of the vertical direction. However, the present disclosure is not limited such a shield configuration. Specifically, a shield may be formed in the respective left and right side walls of the plasma forming box 41 so that the main plates 71 and the sub plates 72 extend from a local region in only a part of the vertical direction. By providing such a shield, it is possible to adjust the intensity of the plasma in the vertical direction inside the plasma forming box 41 and to improve the processing uniformity among the wafers W mounted on the wafer boat 3 in the vertical direction.

Figure 19:
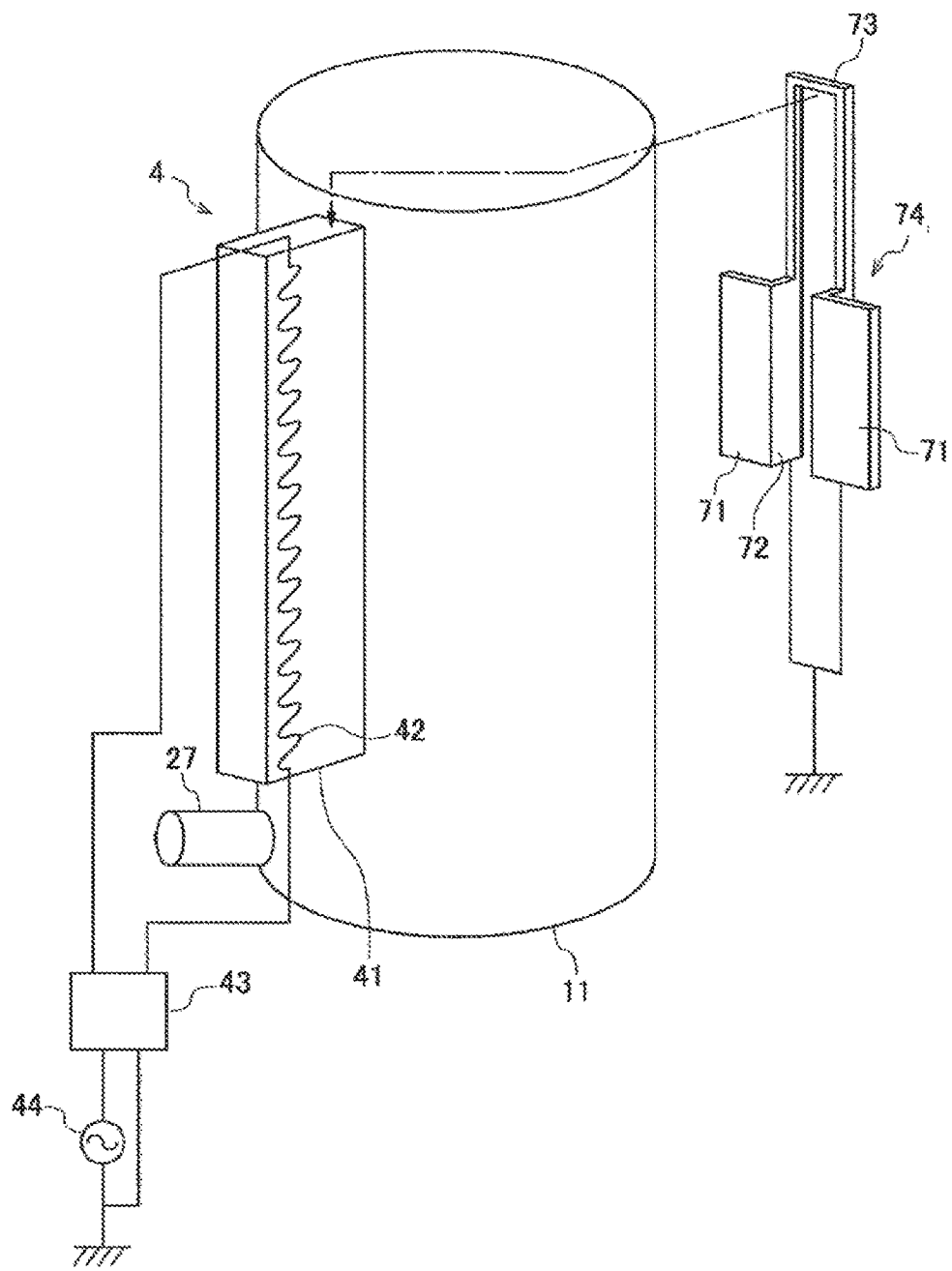
FIG. 19 is a perspective view showing a configuration of a shield provided in the film forming apparatus.

The shield for adjusting the intensity of plasma in the vertical direction will be described as a specific example by focusing on the differences from the shield 7. In a shield 74 shown in FIG. 19, the length in the vertical direction of the main plates 71 and the sub plates 72 is smaller than the length in the vertical direction of the main plates 71 and the sub plates 72 of the shield 7 described above. The respective main plates 71 of the shield 74 is limitedly provided in the vertical central portion on the left and right side walls of the plasma forming box 41. The sub plates 72 are also provided so as to limitedly cover the vertical central portion on the left and right side walls of the plasma forming box 41. By configuring the shield 74 in this manner, the plasma intensity in the vertical central portion inside the plasma forming box 41 is made smaller than the plasma intensity in the upper and lower portions. As with the shield 7, the main plates 71 and the sub plates 72 of the shield 74 are also supported on the plasma forming box 41 by the connecting portion 73. The left and right ends of the connecting portion 73 extend relatively long downward and are connected to the respective sub plates 72 so that the main plates 71 and the sub plates 72 are provided in the vertical central portion of the plasma forming box 41.

Figure 20:
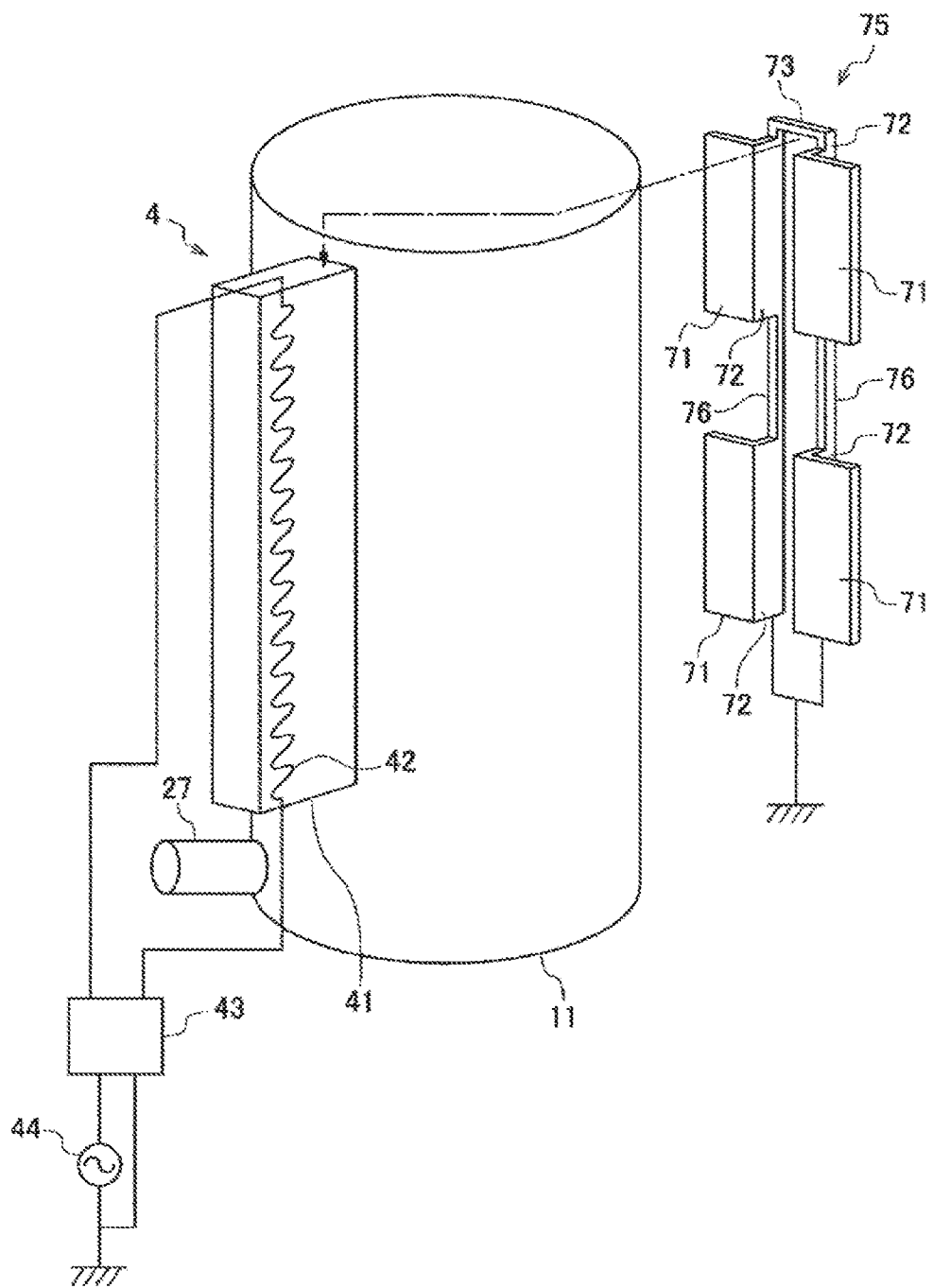
FIG. 20 is a perspective view showing a configuration of a shield provided in the film forming apparatus.

FIG. 20 shows a shield 75. In the shield 75, the main plates 71 and the sub plates 72 are divided vertically and separated from each other so that the plasma intensity in the vertical central portion inside the plasma forming box 41 is larger than the plasma intensity in the upper and lower portions. With such a configuration, the main plates 71 and the sub plates 72 are not provided in the vertical central portion of the plasma forming box 41 and are provided only in the upper portion and the lower portion. On the left side and the right side of the plasma forming box 41, the lower sub plates 72 are supported by rod-shaped members 76 with respect to the upper sub plates 72. The rod-shaped members 76 have electrical conductivity and are provided vertically so as to connect the front side of the lower ends of the upper sub plates 72 and the front side of the upper ends of the lower sub plates 72.

Figure 21:
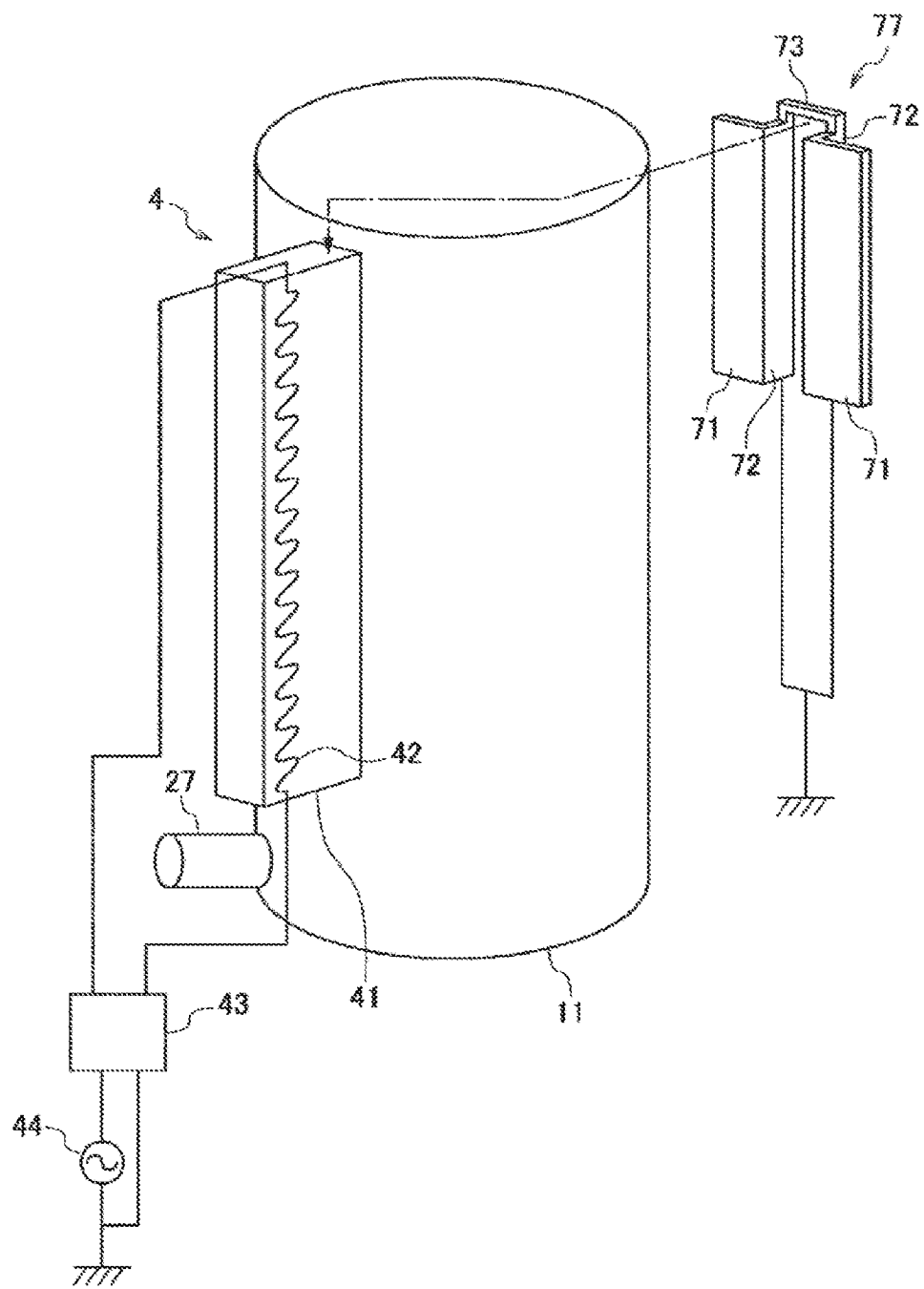
FIG. 21 is a perspective view showing a configuration of a shield provided in the film forming apparatus.

FIG. 21 shows a shield 77. The vertical lengths of the main plates 71 and the sub plates 72 of the shield 77 are shorter than the vertical lengths of the main plates 71 and the sub plates 72 of the shield 7. The main plates 71 and the sub plates 72 are provided only on the upper side when the plasma forming box 41 is viewed by equally or substantially equally bisecting the same in the vertical direction. By configuring the shield 77 in this manner, the plasma intensity on the upper side of the plasma forming box 41 can be made smaller than the plasma intensity on the lower side.

Figure 22:
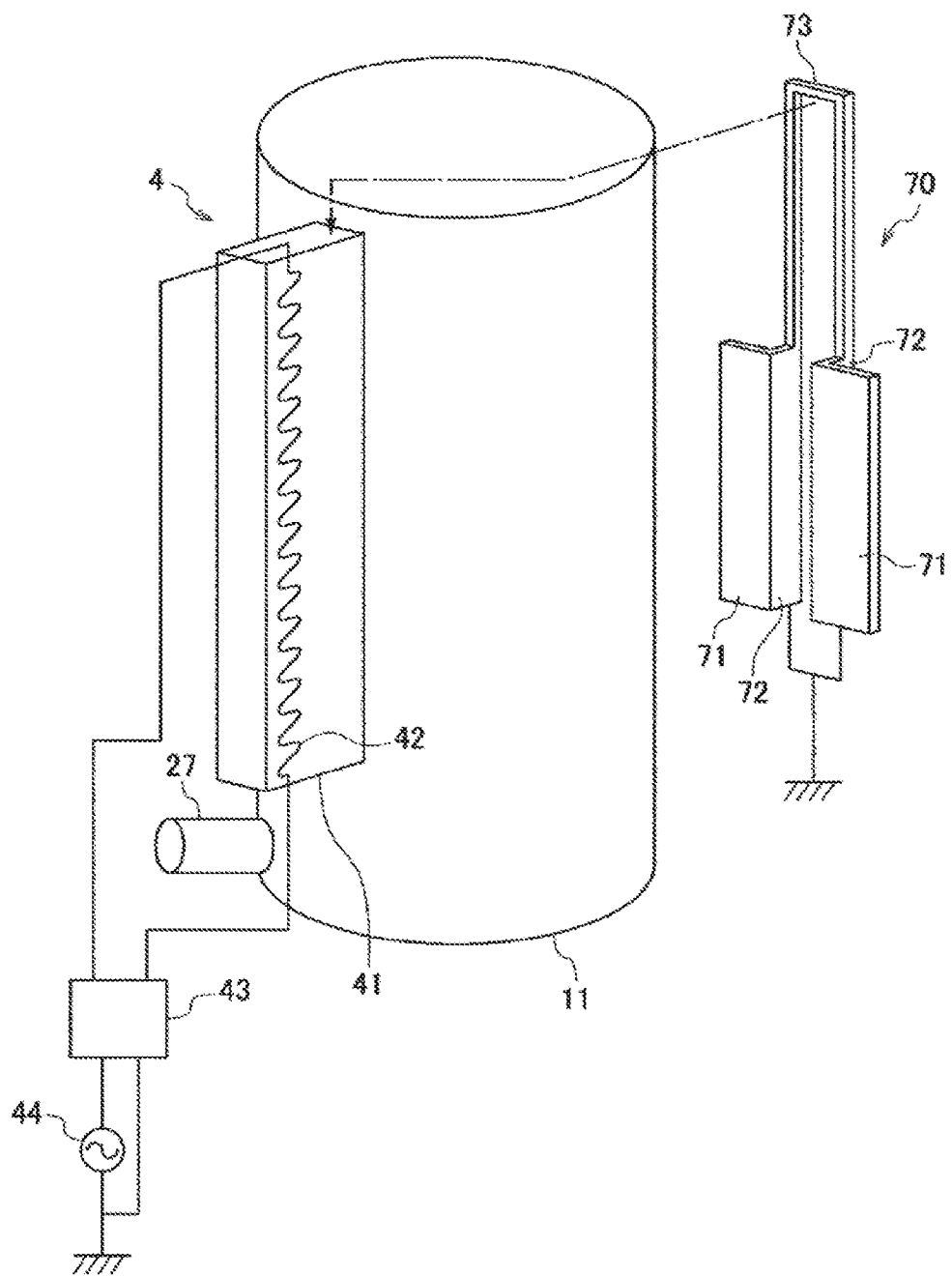
FIG. 22 is a perspective view showing a configuration of a shield provided in the film forming apparatus.

FIG. 22 shows a shield 70. The shield 70 is configured substantially in the same manner as the shield 77 described with reference to FIG. 21. However, the main plates 71 and the sub plates 72 are provided only on the lower side when the plasma forming box 41 is viewed by equally or substantially equally bisecting the same in the vertical direction. That is, the shield 70 is configured such that the plasma intensity on the lower side of the plasma forming box 41 is smaller than the plasma intensity on the upper side.

Figure 23:
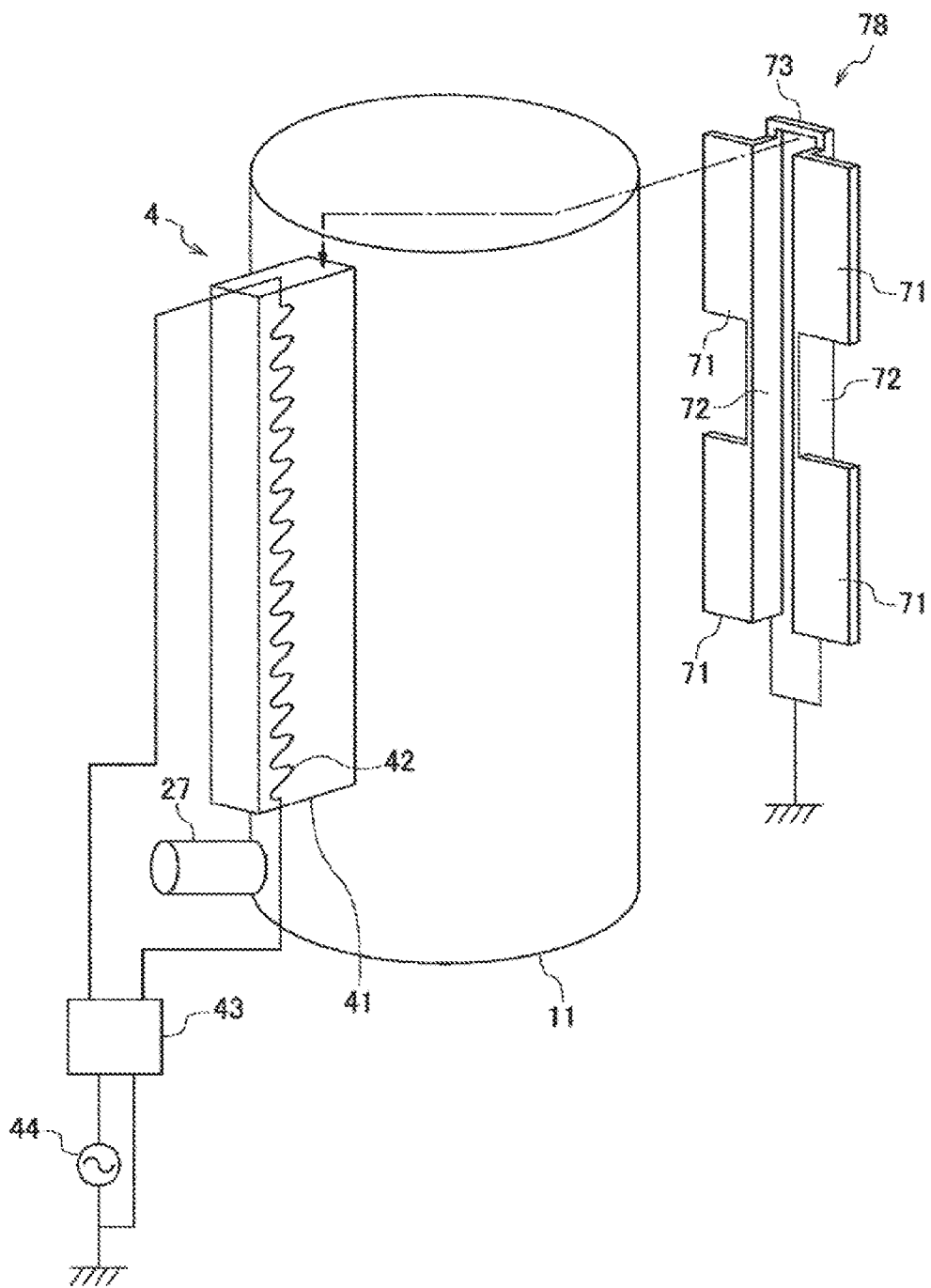
FIG. 23 is a perspective view showing a configuration of a shield provided in the film forming apparatus.

Only the main plates 72 among the main plates 71 and the sub plates 72 may be not provided in a part of the plasma forming box 41 in the vertical direction so as to increase the intensity of plasma. A shield 78 shown in FIG. 23 differs from the shield 7 described with reference to FIG. 1 and the like in that when the plasma forming box 41 is viewed by dividing the same into three parts, i.e., an upper portion a central portion and a lower portion, the main plates 71 are not provided in the central portion. Thus, the plasma intensity in the central portion is relatively large. As with the sub plates 72 of the shield 7, the sub plates 72 of the shield 78 are provided from the upper end to the lower end of the plasma forming box 41.

Figure 24:
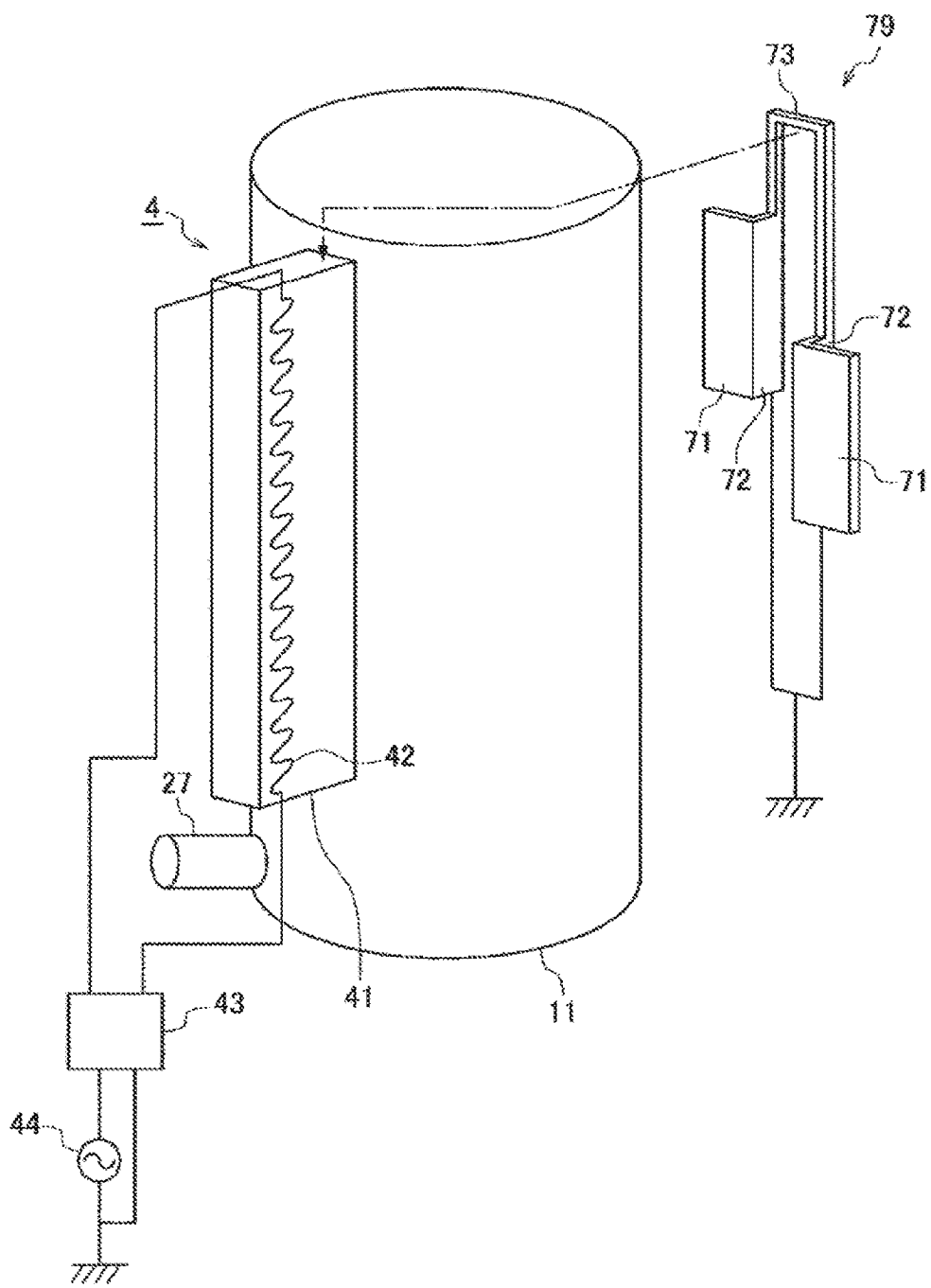
FIG. 24 is a perspective view showing a configuration of a shield provided in the film forming apparatus.

In the respective examples described above, the main plates 71 and the sub plates 72 are located at the same height on the left side and the right side of the plasma forming box 41. However, as in a shield 79 shown in FIG. 24, the height of the left main plate 71 and the left sub plate 72 and the height of the right main plate 71 and the right sub plate 72 may be deviated from each other so that the plasma intensity can be adjusted at the respective height positions. In the respective height regions of the plasma forming box 41, the intensity of plasma can be made smaller in the region where the main plates 71 and the sub plates 72 are disposed on both of the left and right sides than in the region where the main plate 71 and the sub plate 72 are disposed on only one of the left and right sides. In the shield 79, the main plates 71 and the sub plates 72 are provided on the left and right sides only in the vertical central portion of the plasma forming box 41. Incidentally, as described above, the main plates 71 and the sub plates 72 are formed on the left side and the right side of the plasma forming box 41 so as to have an L shape when viewed in the vertical direction. However, the L shape is not limited to a case where the angle formed by the main plate 71 and the sub plate 72 is 90°. The angle formed by the main plate 71 and the sub plate 72 may be larger or smaller than 90°. For example, the L shape includes a case where the angle formed by the main plate 71 and the sub plate 72 is 60° to 120° when viewed in the vertical direction.

According to the present disclosure in some embodiments, there are provided a protrusion portion formed by causing a side peripheral wall of a processing container to swell outward and configured to form a vertically elongated space communicating with a processing space for accommodating a substrate holder and performing a process, an antenna provided in the protrusion portion, and a shield extending leftward and rightward from the protrusion portion at positions closer to the processing space than the antenna. By the shield provided in this way, the plasma conversion of a process gas in the processing space is suppressed. Among the active species constituting the plasma, ions having a relatively short lifetime are restrained from being supplied to the processing space. Furthermore, by appropriately adjusting the arrangement of the antennas, a large amount of electrically neutral radicals having a relatively long lifetime among the active species constituting the plasma can be supplied to substrates. Accordingly, it is possible to perform processing with high uniformity in the plane of each substrate While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus which performs processing by loading a substrate holder holding a plurality of substrates vertically adjacent to each other into a vertical processing container and supplying a process gas, comprising:
   a protrusion portion formed by a side peripheral wall of the processing container which swells outward, and configured to form a vertically elongated space communicating with a processing space for accommodating the substrate holder and performing a process;
   a gas discharge portion provided in the vertically elongated space, and configured to discharge the process gas into the processing space;
   an antenna provided in the protrusion portion along a vertical direction and configured to be supplied with a high-frequency power for converting the process gas into a plasma in the vertically elongated space; and
   a shield extending leftward and rightward from the protrusion portion at respective positions closer to the processing space than the antenna and configured to shield an electric field formed by the antenna and to suppress a formation of the plasma in the processing space.

2. The apparatus of claim 1, wherein the substrate holder is configured to hold a first substrate and a second substrate as the plurality of substrates, and a surface area on a front surface side of the first substrate is 10 times or more than a surface area on a front surface side of the second substrate.

3. The apparatus of claim 1, wherein the shield is formed in an L shape when viewed in the vertical direction by extending from the respective positions, from which the shield extends leftward and rightward from the protrusion portion, toward the processing space.

4. The apparatus of claim 3, wherein the shield is formed in an L shape when viewed in the vertical direction by extending from a local region of a part of the protrusion portion in the vertical direction toward one of a left side and a right side and toward the processing space.

5. The apparatus of claim 1, wherein an attraction portion made of a dielectric material and configured to attract ions constituting the plasma is provided between the vertically elongated space and the substrates held by the substrate holder.

6. The apparatus of claim 5, further comprising:
   a rotation mechanism configured to rotate the substrate holder so that the substrates held by the substrate holder rotate about a center axis of each of the substrates,
   wherein the attraction portion is a plurality of plate-shaped members provided between the substrates, and a peripheral edge of each of the plate-shaped members is configured to be positioned outside a peripheral edge of each of the substrates over an entire circumference of each of the substrates.

* * * * *